(12) United States Patent
Chen et al.

(10) Patent No.: US 8,841,177 B2
(45) Date of Patent: Sep. 23, 2014

(54) CO-INTEGRATION OF ELEMENTAL SEMICONDUCTOR DEVICES AND COMPOUND SEMICONDUCTOR DEVICES

(71) Applicant: International Business Machines Corporation, Armonk, NY (US)

(72) Inventors: Tze-Chiang Chen, Yorktown Heights, NY (US); Cheng-Wei Cheng, White Plains, NY (US); Devendra K. Sadana, Pleasantville, NY (US); Kuen-Ting Shiu, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/677,647

(22) Filed: Nov. 15, 2012

(65) Prior Publication Data

US 2014/0134811 A1    May 15, 2014

(51) Int. Cl.
| | |
|---|---|
| H01L 21/20 | (2006.01) |
| H01L 21/46 | (2006.01) |
| H01L 21/8238 | (2006.01) |
| H01L 29/78 | (2006.01) |
| H01L 27/12 | (2006.01) |
| C30B 25/18 | (2006.01) |
| H01L 21/84 | (2006.01) |
| H01L 21/02 | (2006.01) |
| H01L 21/8258 | (2006.01) |

(52) U.S. Cl.
CPC ........ *H01L 21/823885* (2013.01); *H01L 29/78* (2013.01); *H01L 21/84* (2013.01); *H01L 21/02381* (2013.01); *H01L 27/1266* (2013.01); *C30B 25/183* (2013.01); *H01L 21/8258* (2013.01); *H01L 21/02532* (2013.01); *H01L 21/02639* (2013.01); *H01L 21/823807* (2013.01); *H01L 21/02647* (2013.01)
USPC ........... 438/154; 438/199; 438/222; 438/226; 438/458; 438/481; 438/483

(58) Field of Classification Search
None
See application file for complete search history.

(56) References Cited

U.S. PATENT DOCUMENTS

| | | |
|---|---|---|
| 3,654,000 A | 4/1972 | Totah et al. |
| 5,039,578 A | 8/1991 | Appelbaum et al. |
| 5,728,623 A | 3/1998 | Mori |

(Continued)

OTHER PUBLICATIONS

International Search Report and Written Opinion, dated Jan. 24, 2014, issued in International Application No. PCT/US13/59583.

(Continued)

*Primary Examiner* — Charles Garber
*Assistant Examiner* — Ron Pompey
(74) *Attorney, Agent, or Firm* — Scully, Scott, Murphy & Presser, P.C.; Louis J. Percello, Esq.

(57) ABSTRACT

First and second template epitaxial semiconductor material portions including different semiconductor materials are formed within a dielectric template material layer on a single crystalline substrate. Heteroepitaxy is performed to form first and second epitaxial semiconductor portions on the first and second template epitaxial semiconductor material portions, respectively. At least one dielectric bonding material layer is deposited, and a handle substrate is bonded to the at least one dielectric bonding material layer. The single crystalline substrate, the dielectric template material layer, and the first and second template epitaxial semiconductor material portions are subsequently removed. Elemental semiconductor devices and compound semiconductor devices can be formed on the first and second semiconductor portions, which are embedded within the at least one dielectric bonding material layer on the handle substrate.

25 Claims, 32 Drawing Sheets

(56) References Cited

U.S. PATENT DOCUMENTS

| | | | |
|---|---|---|---|
| 6,075,262 A | 6/2000 | Moriuchi et al. | |
| 6,171,936 B1 | 1/2001 | Fitzgerald | |
| 6,323,108 B1 | 11/2001 | Kub et al. | |
| 6,455,398 B1 | 9/2002 | Fonstad, Jr. et al. | |
| 7,282,425 B2 | 10/2007 | Koester et al. | |
| 7,544,548 B2 | 6/2009 | Sadaka et al. | |
| 7,638,842 B2 | 12/2009 | Currie et al. | |
| 7,713,803 B2 | 5/2010 | Jin et al. | |
| 7,777,250 B2 | 8/2010 | Lochtefeld | |
| 7,964,896 B2 | 6/2011 | Kiewra et al. | |
| 8,053,810 B2 | 11/2011 | Barwicz et al. | |
| 8,314,463 B2 | 11/2012 | Cai et al. | |
| 8,324,660 B2 | 12/2012 | Lochtefeld et al. | |
| 8,610,172 B2 * | 12/2013 | Guo et al. | 257/192 |
| 2007/0281436 A1 * | 12/2007 | Sadaka et al. | 438/400 |
| 2008/0099785 A1 | 5/2008 | Bai et al. | |
| 2008/0179628 A1 | 7/2008 | Wei et al. | |
| 2008/0237573 A1 | 10/2008 | Jin et al. | |
| 2008/0268587 A1 | 10/2008 | Sadaka et al. | |
| 2008/0289958 A1 * | 11/2008 | Kardokus et al. | 204/298.12 |
| 2009/0039361 A1 | 2/2009 | Li et al. | |
| 2009/0278233 A1 | 11/2009 | Pinnington et al. | |
| 2010/0022074 A1 | 1/2010 | Wang et al. | |
| 2010/0230779 A1 | 9/2010 | Anderson et al. | |
| 2010/0258809 A1 | 10/2010 | Muller | |
| 2010/0304547 A1 | 12/2010 | Pinto et al. | |
| 2011/0147706 A1 | 6/2011 | Radosavljevic et al. | |
| 2012/0217622 A1 | 8/2012 | Bedell et al. | |

OTHER PUBLICATIONS

Takagi, S. et al., "III-V/Ge CMOS Technologies on Si Platform" IEEE Symposium on VLSI Technology Digest of Technical Papers (Jun. 15-17, 2010) pp. 147-148.

Leite, M.S. et al., "Wafer-Scale Strain Engineering of Ultrathin Semiconductor Crystalline Layers" Advanced Materials (Sep. 1, 2011) pp. 1-7, vol. 23, Issue 33.

U.S. Appl. No. 13/326,825, filed Dec. 15, 2011, Entitled: "FETs with Hybrid Channel Materials" First Named Inventor: Guo, D. et al.

Office Action dated Feb. 4, 2014 received in a related U.S. Patent Application, namely U.S. Appl. No. 13/687,314.

* cited by examiner

CO-INTEGRATION OF ELEMENTAL SEMICONDUCTOR DEVICES AND COMPOUND SEMICONDUCTOR DEVICES

BACKGROUND

The present disclosure relates to a semiconductor structure, and particularly to semiconductor structures including elemental semiconductor devices and compound semiconductor devices and a method of manufacturing the same.

Compound semiconductor devices can provide enhanced device performance compared to elemental semiconductor devices in some aspects, while elemental semiconductor devices can provide an advantage over compound semiconductor devices in other aspects. For example, many III-V compound semiconductor materials can provide higher electron mobility compared to silicon, germanium, or silicon germanium alloys, and are suitable for n-type metal-oxide-semiconductor devices. At the same time, silicon, germanium, or silicon germanium alloys can provide high hole mobility, and may be suitable for p-type metal-oxide-semiconductor devices. Thus, it would be desirable to integrate compound semiconductor devices and elemental semiconductor devices on a same substrate without losing advantages inherent to respective semiconductor devices in order to provide a set of high performance devices such as complementary metal-oxide-semiconductor (CMOS) semiconductor devices.

BRIEF SUMMARY

A first trench and a second trench are formed through a dielectric template material layer on a single crystalline substrate. A first template epitaxial semiconductor material portion is formed within the first trench by epitaxy of a first template semiconductor material, and a second template epitaxial semiconductor material portion is formed within the second trench by epitaxy of a second template semiconductor material. One of the first and second template semiconductor materials can be an elemental semiconductor material, and the other of the first and second template semiconductor materials can be a compound semiconductor material. A first epitaxial semiconductor portion including a first semiconductor material that is different from the first template semiconductor material is epitaxially grown on the first template epitaxial semiconductor material portion, and a second epitaxial semiconductor portion including a second semiconductor material that is different from the second template semiconductor material is epitaxially grown on the second template epitaxial semiconductor material portion. At least one dielectric bonding material layer is deposited, and a handle substrate is bonded to the at least one dielectric bonding material layer. The single crystalline substrate, the dielectric template material layer, and the first and second template epitaxial semiconductor material portions are subsequently removed. Elemental semiconductor devices and compound semiconductor devices can be formed on the first and second semiconductor portions, at least one of which is embedded within the at least one dielectric bonding material layer on the handle substrate.

According to an aspect of the present disclosure, a method of forming a semiconductor structure is provided. A first trench and a second trench are formed through a dielectric template material layer on a single crystalline substrate. A first template epitaxial semiconductor material portion is formed within the first trench by epitaxy of a first template semiconductor material and a second template epitaxial semiconductor material portion is formed within the second trench by epitaxy of a second template semiconductor material. One of the first and second template semiconductor materials is an elemental semiconductor material, and another of the first and second template semiconductor materials is a compound semiconductor material. A first epitaxial semiconductor portion including a first semiconductor material that is different from the first template semiconductor material is epitaxially grown on the first template epitaxial semiconductor material portion. A second epitaxial semiconductor portion including a second semiconductor material that is different from the second template semiconductor material is epitaxially grown on the second template epitaxial semiconductor material portion. At least one dielectric bonding material layer is formed over the first and second epitaxial semiconductor portions. A handle substrate is bonded to the at least one dielectric bonding material layer. The single crystalline substrate, the dielectric template material layer, and the first and second template epitaxial semiconductor material portions are removed.

According to another aspect of the present disclosure, a semiconductor structure includes at least one dielectric bonding material layer located on a handle substrate. The semiconductor structure further includes a first epitaxial semiconductor portion and a second epitaxial semiconductor portion. At least a lower portion of one of the first and second epitaxial semiconductor portions is embedded within the at least one bonding material layer. One of the first and second epitaxial semiconductor portions include a single crystalline elemental semiconductor material, and another of the first and second epitaxial semiconductor portions include a single crystalline compound semiconductor material.

DETAILED DESCRIPTION

Figure 1:
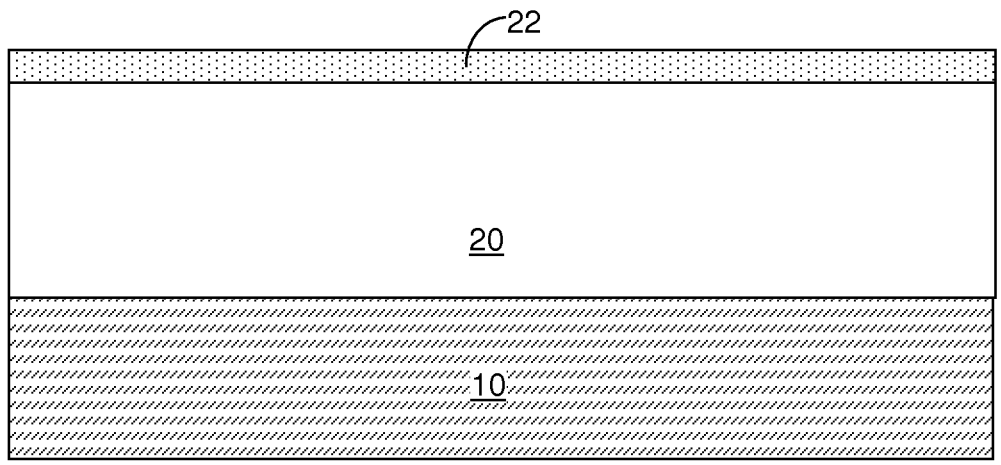
FIG. 1 is a vertical cross-sectional view of a first exemplary semiconductor structure after formation of a dielectric template material layer and a dielectric hard mask layer according to a first embodiment of the present disclosure.

As stated above, the present disclosure relates to semiconductor structures including elemental semiconductor devices and compound semiconductor devices and a method of manufacturing the same. Aspects of the present disclosure are now described in detail with accompanying figures. It is noted that like reference numerals refer to like elements across different embodiments. The drawings are not necessarily drawn to scale.

Referring to FIG. 1, a first exemplary semiconductor structure according to a first embodiment of the present disclosure includes a single crystalline substrate 10, a dielectric template material layer 20 formed thereupon, and a dielectric hard mask layer 22 formed on the top surface of the dielectric template material layer 20. The single crystalline substrate 10 includes a single crystalline material, which can be a single crystalline elemental semiconductor material or a single crystalline compound semiconductor material. As used herein, an elemental semiconductor material refers to a semiconductor material in which a predominant portion (i.e., more than 50% in atomic percentage) is at least one Group IV semiconductor material. As used herein, a compound semiconductor material refers to a semiconductor material in which a predominant portion includes at least one compound semiconductor material. The single crystalline substrate 10 can include, for example, single crystalline silicon, single crystalline germanium, a single crystalline silicon-germanium alloy, a single crystalline silicon-carbon alloy, and/or a single crystalline silicon-germanium-carbon alloy. Alternately or additionally, the single crystalline substrate 10 can include a III-V compound semiconductor material and/or a II-V compound semiconductor material. In one embodiment, the entirety of the top surface of the single crystalline substrate 10 can be a surface of a same single crystalline semiconductor material.

The dielectric template material layer 20 includes a dielectric material such as doped silicon oxide, undoped silicon oxide, a dielectric thermal oxide of the semiconductor material of the single crystalline substrate 10, an organosilicate glass, or a combination thereof. The dielectric template material layer 20 can be deposited, for example, by chemical vapor deposition (CVD), spin coating, or a conversion of a top portion of the single crystalline substrate by thermal oxidation (e.g., thermal oxidation of silicon or a silicon germanium alloy). The thickness of the dielectric template material layer 20 can be from 50 nm to 2,000 nm, although lesser and greater thicknesses can also be employed.

The dielectric hard mask layer 22 includes a dielectric material having a different composition than the dielectric template material layer 20. In one embodiment, the dielectric hard mask layer 22 can include a material having a greater resistance to an abrasion (e.g., a chemical mechanical planarization (CMP) process) than the material of the dielectric template material layer 20 and/or a greater resistance to an etch chemistry that can remove the dielectric material of the dielectric template material layer 20 than the material of the dielectric template material layer 20. For example, the dielectric hard mask layer 22 can include silicon nitride, a dielectric metal oxide such as $HfO_2$ or $ZrO_2$, a dielectric metal nitride, or a combination thereof. The dielectric hard mask layer 22 can be deposited by chemical vapor deposition (CVD) or atomic layer deposition (ALD). In one embodiment, the thickness of the dielectric hard mask layer 22 can be from 3 nm to 30 nm, although lesser and greater thicknesses can also be employed.

Figure 2:
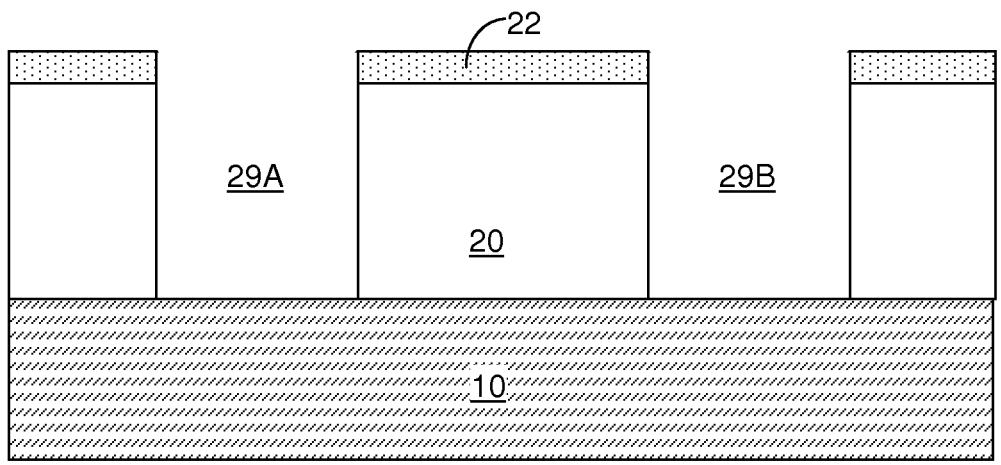
FIG. 2 is a vertical cross-sectional view of the first exemplary semiconductor structure after formation of a first trench and a second trench according to the first embodiment of the present disclosure.

Referring to FIG. 2, a first trench 29A and a second trench 29B are formed through the dielectric template material layer 20, for example, by applying and patterning a photoresist layer (not shown) to form two openings therein, and by etching physically exposed areas within the two openings of the patterned photoresist layer with an anisotropic etch. A surface of the single crystalline substrate 10 is physically exposed at the bottom of each of the first and second trenches (29A, 29B). In one embodiment, the thickness of the dielectric template material layer 20 and the lateral dimensions of the first and second trenches (29A, 29B) can be selected such that the aspect ratio of each trench (29A, 29B) can be greater than 1.0. As used herein, an aspect ratio refers to the ratio of the height of a trench to the minimum lateral dimension between sidewalls of the trench. A trench having an aspect ratio greater than 1.0 is herein referred to as a "high aspect ratio trench."

Figure 3:
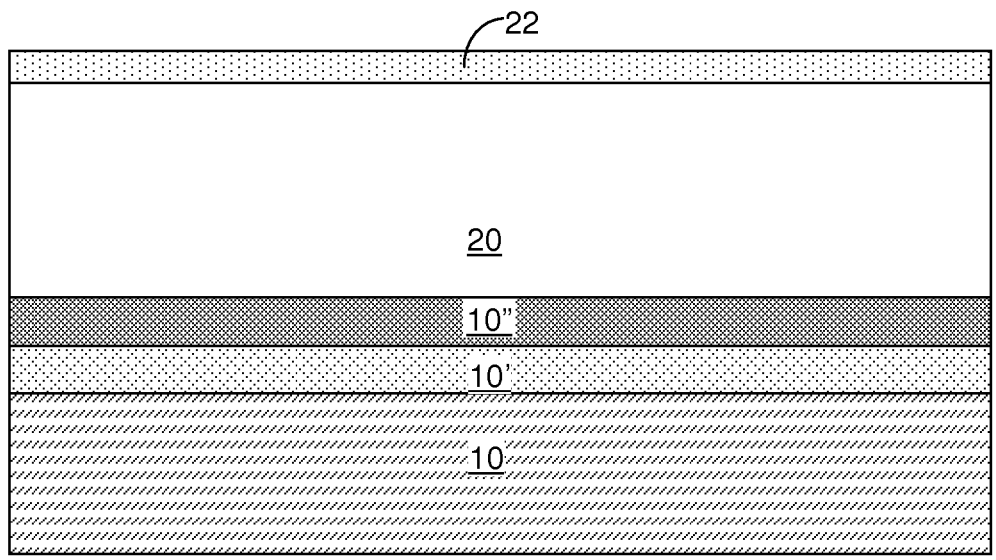
FIG. 3 is a vertical cross-sectional view of a first variation of the first exemplary semiconductor structure after formation of at least one lattice-mismatched epitaxial semiconductor material layer, a dielectric template material layer, and a dielectric hard mask layer according to the first embodiment of the present disclosure.

Referring to FIG. 3, a first variation of the first exemplary semiconductor structure of the present disclosure can be derived from the first exemplary semiconductor structure by employing at least one lattice-mismatched epitaxial semiconductor material layer, which can include, for example, a first lattice-mismatched epitaxial semiconductor material layer 10' and a second lattice-mismatched epitaxial semiconductor material layer 10". As used herein, a "lattice mismatch" refers to a condition in which a first lattice constant of a first single crystalline material is different from a second lattice constant of a second single crystalline material.

Each of the at least one lattice-mismatched epitaxial semiconductor material layer (10', 10") is in epitaxial alignment with the single crystalline structure of the single crystalline substrate 10. The degree of lattice mismatch between each of the at least one lattice-mismatched epitaxial semiconductor material layer (10', 10") and an underlying semiconductor material layer on which the lattice-mismatched epitaxial semiconductor material layer (10' or 10") is deposited is such that epitaxial deposition is possible despite the lattice mismatch, and the atomic registry is preserved through generation of misfit dislocations and lattice relaxation of the deposited single crystalline material of the lattice-mismatched epitaxial semiconductor material layer (10' or 10") with thickness. The thickness of each lattice-mismatched epitaxial semiconductor material layer (10', 10") can be from 100 nm to 10 microns.

Figure 4:
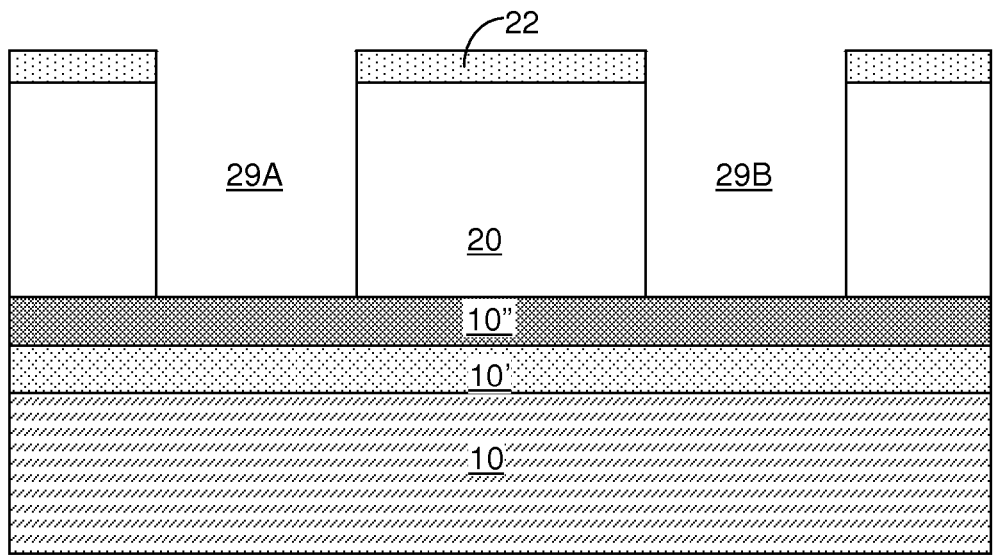
FIG. 4 is a vertical cross-sectional view of the first variation of the first exemplary semiconductor structure after formation of a first trench and a second trench according to the first embodiment of the present disclosure.

Referring to FIG. 4, the first and second trenches (29A, 29B) can be formed employing the methods of the processing step of FIG. 2. Portions of the dielectric template material layer 20 and optionally portions of the at least one lattice-mismatched epitaxial semiconductor material layer (10', 10") are etched to form the first and second trenches (29A, 29B).

Figure 5:
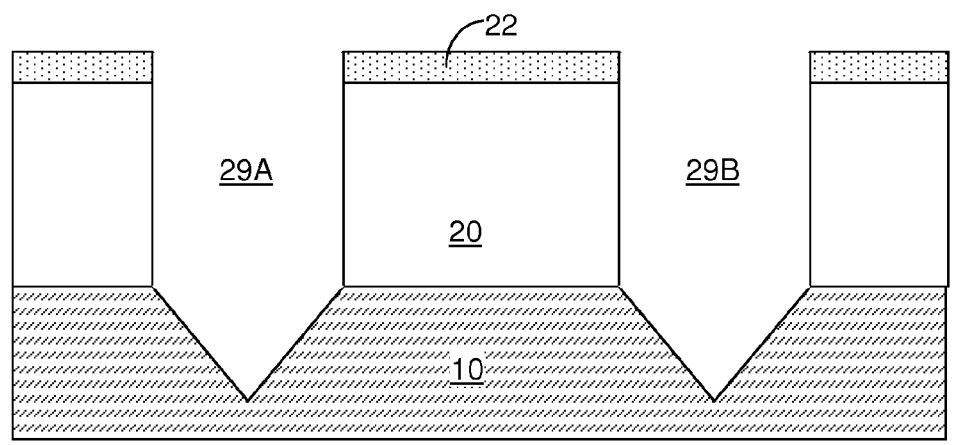
FIG. 5 is a vertical cross-sectional view of a second variation of the first exemplary semiconductor structure after formation of a first trench and a second trench according to the first embodiment of the present disclosure.

Referring to FIG. 5, a second variation of the first exemplary semiconductor structure of the present disclosure can be derived from the first exemplary semiconductor structure or the first variation of the first exemplary semiconductor structure by employing a facet-forming etch process at least during a latter portion of the etch process that forms the first and second trenches (29A, 29B). The facet-forming etch chemistry can be a wet etch chemistry or a dry etch chemistry as known in the art. The first and second trenches (29A, 29B) extend into the single crystalline substrate 10. Bottom surfaces of the first and second trenches (29A, 29B) include faceted crystallographic surfaces of the single crystalline substrate 10.

Figure 6:
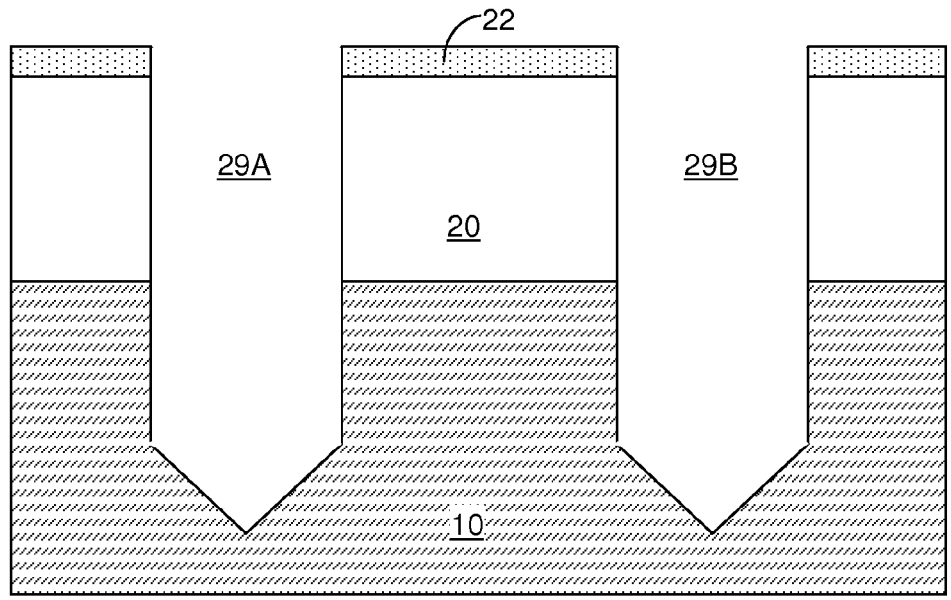
FIG. 6 is a vertical cross-sectional view of a third variation of the first exemplary semiconductor structure after formation of a first trench and a second trench according to the first embodiment of the present disclosure.

Referring to FIG. 6, a third variation of the first exemplary semiconductor structure of the present disclosure can be derived from the first exemplary semiconductor structure of FIG. 2, the first variation of the first exemplary semiconductor structure of FIG. 4, or the second variation of the first exemplary semiconductor structure of FIG. 5 by anisotropically etching, and optionally crystallographically etching, the single crystalline substrate 10. The first and second trenches (29A, 29B) extend into the single crystalline substrate 10. Bottom surfaces of the first and second trenches (29A, 29B) include faceted crystallographic surfaces of the single crystalline substrate 10. Further, sidewall surfaces of the first and second trenches (29A, 29B) include vertical surfaces of the single crystalline substrate 10. The vertical distance between the bottommost point of each trench (29A, 29B) and the interface between the single crystalline substrate 10 and the dielectric template material layer 20 can be from 50 nm to 50 microns, although lesser and greater vertical distances can also be employed. The increased depth of the first and second trenches (29A, 29B) increases the aspect ratio of the first and second trenches (29A, 29B), which can decrease crystallographic defects of single crystalline semiconductor materials to be subsequently deposited in the first and second trenches (29A, 29B).

Figure 7:
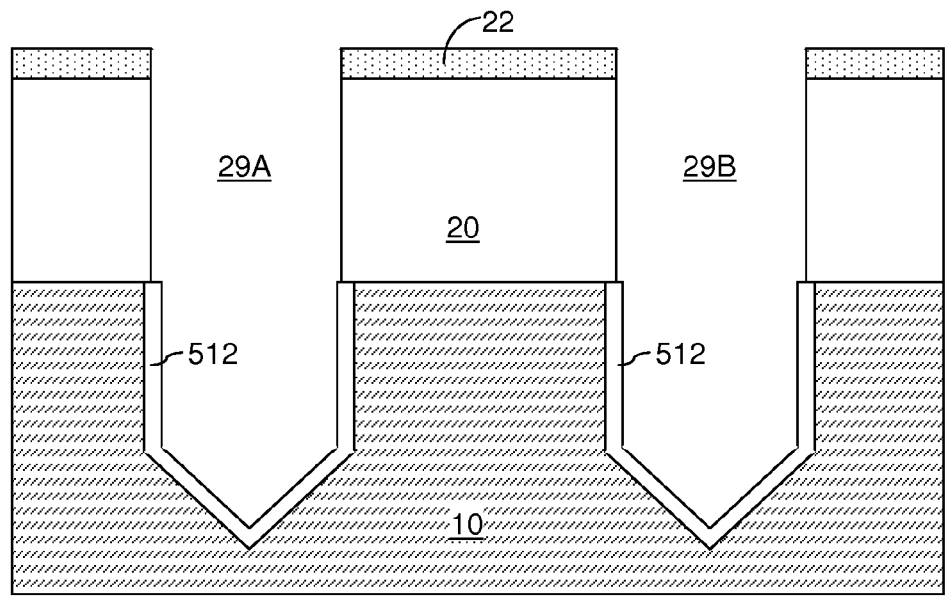
FIG. 7 is a vertical cross-sectional view of the third variation of the first exemplary semiconductor structure after converting surface portions of a single crystalline substrate into dielectric material portions according to the first embodiment of the present disclosure.

Referring to FIG. 7, surface portions of a single crystalline substrate 10 of the third variation of the first exemplary semiconductor structure can be converted into dielectric material portions, for example, by thermal oxidation, plasma oxidation, thermal nitridation, plasma nitridation, or a combination thereof. A dielectric material portion 512 is formed below the interface between the single crystalline substrate 10 and the dielectric template material layer 20. For example, if the single crystalline substrate 10 includes silicon, the dielectric material portion 512 includes silicon oxide.

Figure 8:
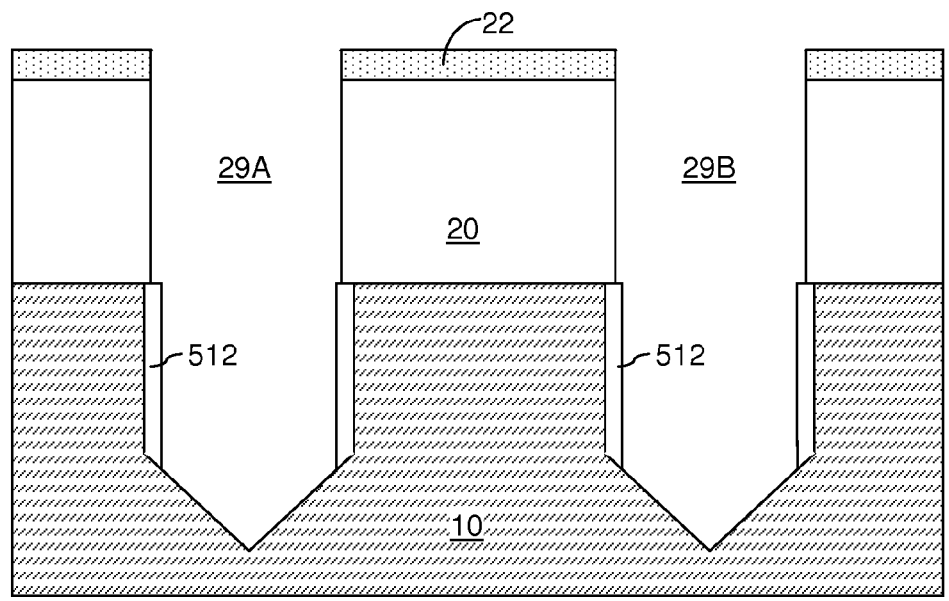
FIG. 8 is a vertical cross-sectional view of the third variation of the first exemplary semiconductor structure after removal of bottom subportions of the dielectric material portions according to the first embodiment of the present disclosure.

Referring to FIG. 8, bottom subportions of the dielectric material portions 512 are removed, for example, by an anisotropic etch to physically expose surfaces of the single crystalline substrate 10. In one embodiment, the physically exposed surfaces of the single crystalline substrate 10 can be faceted crystallographic surfaces.

Figure 9:
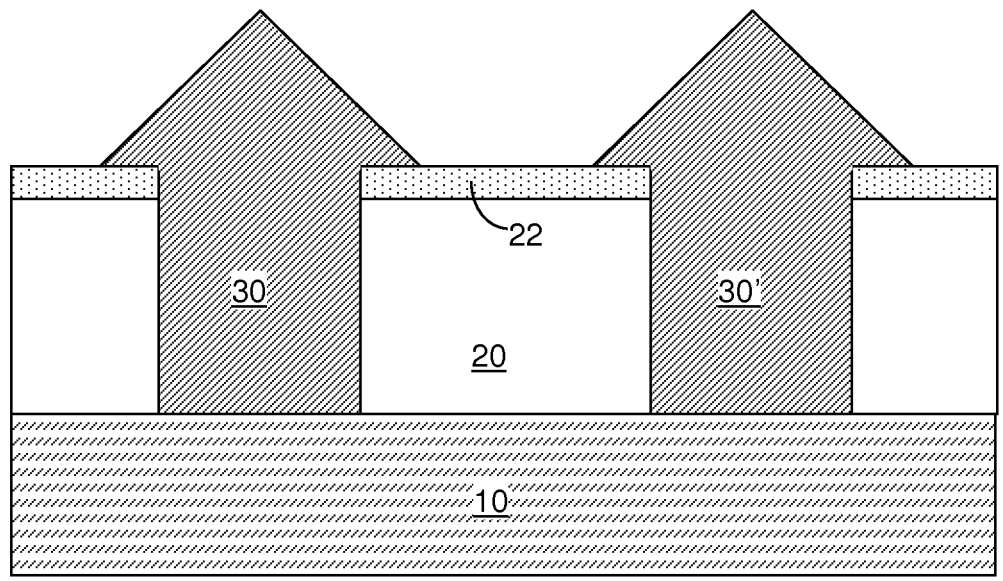
FIG. 9 is a vertical cross-sectional view of the first exemplary semiconductor structure after forming first template epitaxial semiconductor material portions according to the first embodiment of the present disclosure.

Referring to FIG. 9, selective epitaxy of a semiconductor material, which is herein referred to as a first template epitaxial semiconductor material, is performed to simultaneously form a first template epitaxial semiconductor material portion 30 in the first trench 29A and another first template epitaxial semiconductor material portion 30' in the second trench 29B.

In one embodiment, the first template epitaxial semiconductor material can be an elemental semiconductor material. For example, the first template epitaxial semiconductor material can be single crystalline silicon, single crystalline germanium, a single crystalline silicon-germanium alloy, a single crystalline silicon-carbon alloy, and a single crystalline silicon-germanium-carbon alloy. In another embodiment, the first template epitaxial semiconductor material can be a compound semiconductor material such as a indium phosphide, other III-V compound semiconductor material and a II-V compound semiconductor material. The first template epitaxial semiconductor material can be the same as, or can be different from, the single crystalline semiconductor material of the single crystalline semiconductor substrate 10.

The single crystalline semiconductor material of the single crystalline semiconductor substrate 10 has a substrate lattice constant, and the first template epitaxial semiconductor material has a first lattice constant. The first lattice constant can be the same as, or can be different from, the substrate lattice constant. In one embodiment, the first template epitaxial semiconductor material portions (30, 30') are epitaxially aligned to the single crystalline structure of the single crystalline substrate 10 with a lattice mismatch. In one embodiment, the first lattice constant can differ from the substrate lattice constant by a mismatch percentage of the substrate lattice constant such that the mismatch percentage is in a range from 1.0% to 15%.

Figure 10:
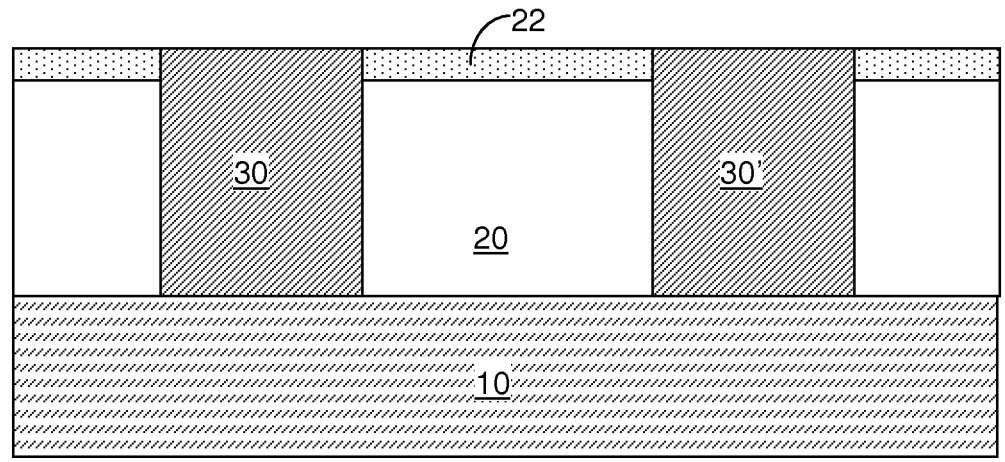
FIG. 10 is a vertical cross-sectional view of the third variation of the first exemplary semiconductor structure after planarization of the first template epitaxial semiconductor material portions employing the dielectric hard mask layer as a stopping layer according to the first embodiment of the present disclosure.

Referring to FIG. 10, the first template epitaxial semiconductor material portions (30, 30') can be planarized, for example, by chemical mechanical planarization (CMP) employing the dielectric hard mask layer 22 as a stopping layer. Portions of the first template semiconductor material are removed from above the horizontal plane of the top surface of the dielectric hard mask layer 22. Top surfaces of the first template epitaxial semiconductor material portions (30, 30') are coplanar with the top surface of the dielectric hard mask layer 22.

Figure 11:
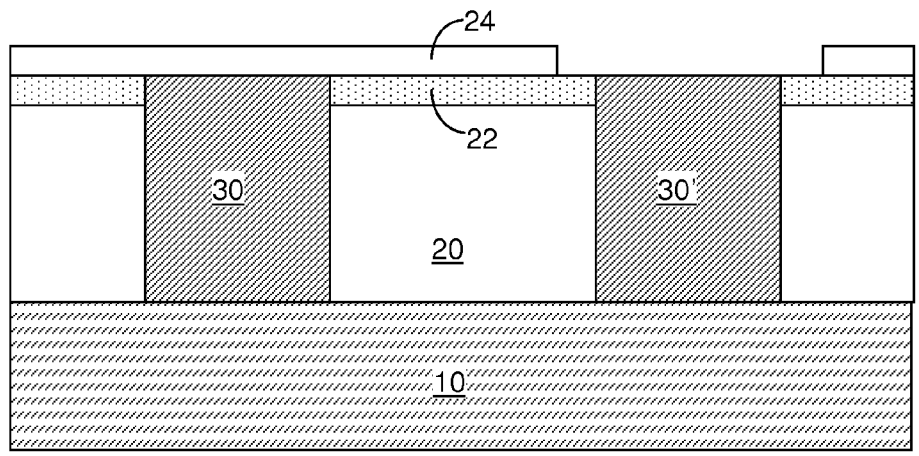
FIG. 11 is a vertical cross-sectional view of the first exemplary semiconductor structure after deposition and patterning of a disposable masking layer according to the first embodiment of the present disclosure.

Referring to FIG. 11, a disposable masking layer 24 is deposited and patterned (for example, by a combination of lithographic methods and an etch) to form an opening over one of the two first template epitaxial semiconductor material portions (30, 30'), i.e., the other first template epitaxial semiconductor material portion 30'.

Figure 12:
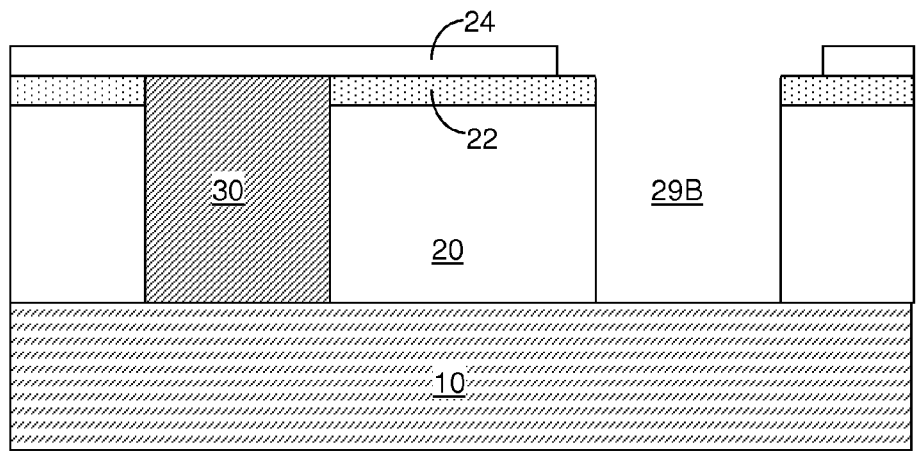
FIG. 12 is a vertical cross-sectional view of the first exemplary semiconductor structure after removal of one of the two first template epitaxial semiconductor material portions according to the first embodiment of the present disclosure.

Referring to FIG. 12, the other first template epitaxial semiconductor material portion 30' is removed from the second trench 29B selective to the dielectric material of the dielectric template material layer 20 by an etch, which can be a wet etch or a dry etch. The second cavity 29B becomes empty, and at least one single crystalline surface (which may include crystallographic facets) of the single crystalline substrate 10 is physically exposed at the bottom of the second trench 29B.

Figure 13:
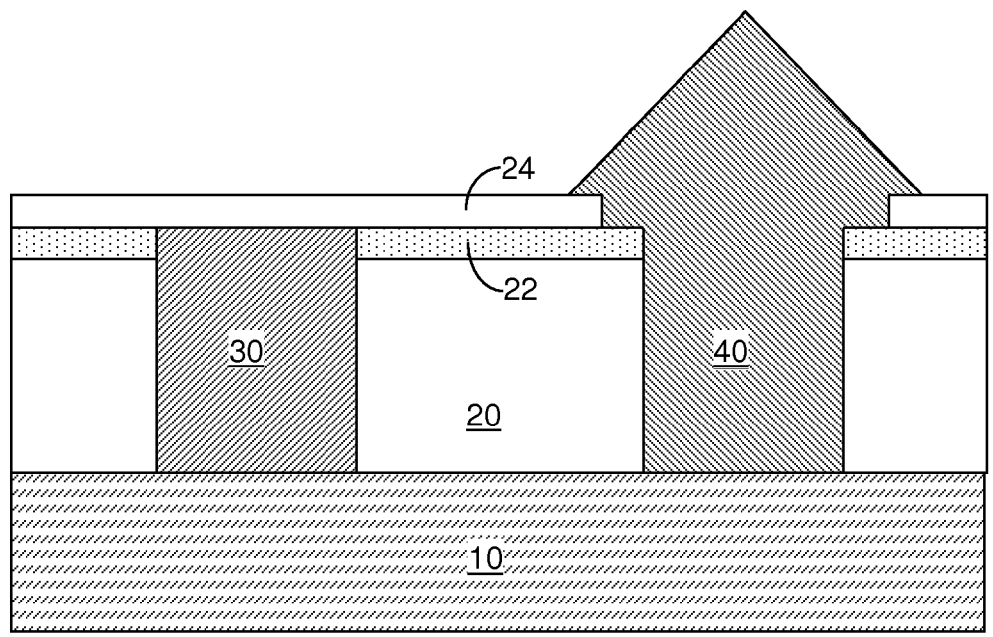
FIG. 13 is a vertical cross-sectional view of the first exemplary semiconductor structure after formation of a second template epitaxial semiconductor material portion according to the first embodiment of the present disclosure.

Referring to FIG. 13, selective epitaxy of another semiconductor material, which is herein referred to as a second template epitaxial semiconductor material, is performed to form a second template epitaxial semiconductor material portion 40 in the second trench 29B. One of the first and second template semiconductor materials is an elemental semiconductor material, and another of the first and second template semiconductor materials is a compound semiconductor material.

In one embodiment, the first template epitaxial semiconductor material can be an elemental semiconductor material, and the second template epitaxial semiconductor material can be a compound semiconductor material. In another embodiment, the first template epitaxial semiconductor material can be a compound semiconductor material, and the second template epitaxial semiconductor material can be an elemental semiconductor material. The second template epitaxial semiconductor material can be the same as, or can be different from, the single crystalline semiconductor material of the single crystalline semiconductor substrate 10. At least one of the first and second template epitaxial semiconductor materials is different from the single crystalline semiconductor material of the single crystalline semiconductor substrate 10.

The single crystalline semiconductor material of the single crystalline semiconductor substrate 10 has the substrate lattice constant, and the second template epitaxial semiconductor material has a second lattice constant. The second lattice constant can be the same as, or can be different from, the substrate lattice constant. In one embodiment, the second template epitaxial semiconductor material portion 40 epitaxially aligned to the single crystalline structure of the single crystalline substrate 10 with a lattice mismatch. In one embodiment, the second lattice constant can differ from the substrate lattice constant by a mismatch percentage of the substrate lattice constant such that the mismatch percentage is in a range from 1.0% to 15%.

In one embodiment, at least one of the first lattice constant and the second lattice constant is different from the substrate lattice constant. In one embodiment, at least one of the first lattice constant and the second lattice constant differs from the substrate lattice constant by a mismatch percentage of the substrate lattice constant such that the mismatch percentage is in a range from 1.0% to 15%. In one embodiment, each of the first template epitaxial semiconductor material portion 20 and the second template epitaxial semiconductor material portion 40 can be epitaxially aligned to the single crystalline structure of the single crystalline substrate 10 with a lattice mismatch.

Figure 14:
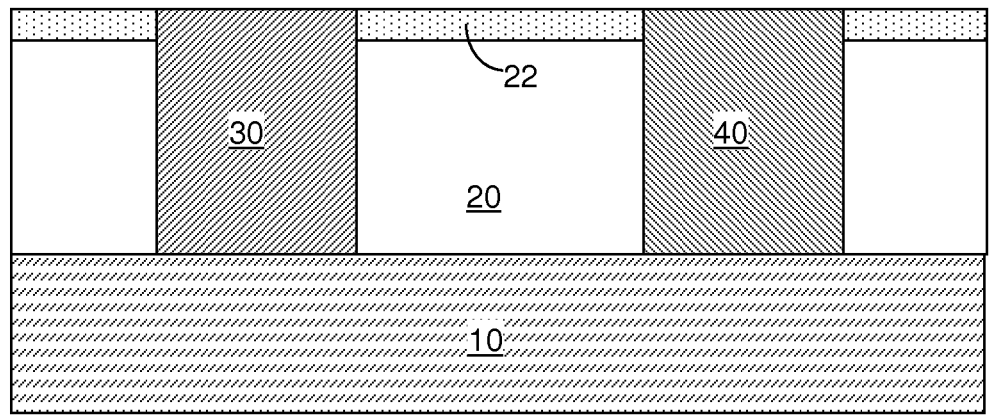
FIG. 14 is a vertical cross-sectional view of the first exemplary semiconductor structure after planarization of the second template epitaxial semiconductor material portion according to the first embodiment of the present disclosure.

Referring to FIG. 14, the second template epitaxial semiconductor material portion 40 can be planarized, for example, by chemical mechanical planarization (CMP) employing the dielectric hard mask layer 22 as a stopping layer. Portions of the first template semiconductor material and the disposable masking layer 24 are removed from above the horizontal plane of the top surface of the dielectric hard mask layer 22.

Top surfaces of the first template epitaxial semiconductor material portion 30 and the second template epitaxial semiconductor material portion 40 are coplanar with the top surface of the dielectric hard mask layer 22.

Figure 15:
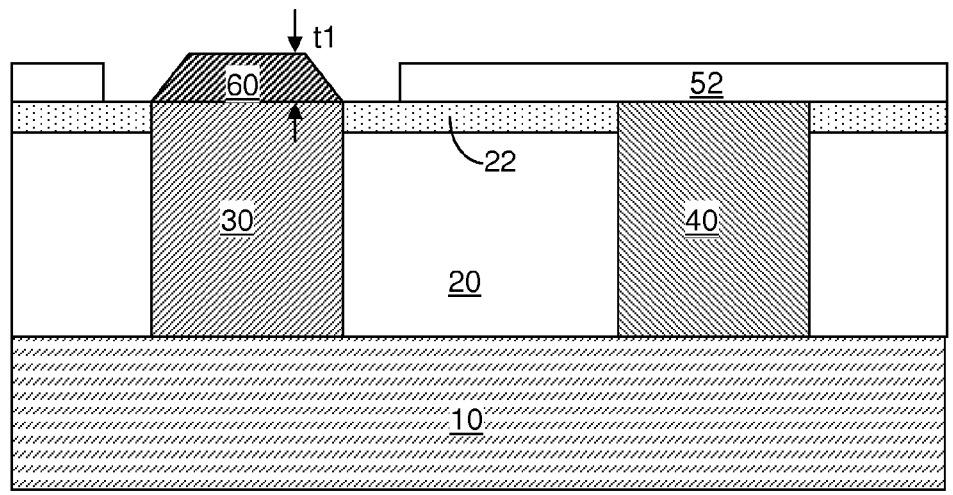
FIG. 15 is a vertical cross-sectional view of the first exemplary semiconductor structure after deposition and patterning of a first dielectric bonding material layer and formation of a first epitaxial semiconductor portion according to the first embodiment of the present disclosure.

Referring to FIG. 15, a first dielectric bonding material layer 52 is deposited and patterned to provide an opening over the first template epitaxial semiconductor material portion 30. The first dielectric bonding material layer 52 includes a dielectric material that can provide sufficient adhesion to the material of the dielectric hard mask layer 22 to prevent delamination of the dielectric hard mask layer 22. In one embodiment, the first dielectric bonding material layer 52 can include an undoped silicon oxide material (such as undoped silicate glass (USG)), a doped semiconductor oxide material (such as borophosphosilicate glass, borosilicate glass, phosphosilicate glass, fluorosilicate glass, etc.), a spin-on glass (SOG) material, or a combination thereof. The thickness of the first dielectric bonding material layer 52 can be from 3 nm to 300 nm, although lesser and greater thicknesses can also be employed.

The patterning of the first dielectric bonding material layer 52 is performed such that the second template epitaxial semiconductor material portion 40 is covered with the patterned first dielectric bonding material layer 52, and a top surface of the first template epitaxial semiconductor material portion 30 is physically exposed. A first epitaxial semiconductor portion 60 is grown directly on the first template epitaxial semiconductor material portion 30 employing a selective epitaxy process. The selective epitaxy deposits a first semiconductor material on the top surface of the first template epitaxial semiconductor material portion 30. The first semiconductor material is different from the first template semiconductor material of the first template epitaxial semiconductor material portion 30.

In one embodiment, the first template semiconductor material of the first template epitaxial semiconductor material portion 30 is a first elemental semiconductor material and the first semiconductor material of the first epitaxial semiconductor portion 60 is a second elemental semiconductor material that is different from the first elemental semiconductor material. The first and second elemental semiconductor materials are selected such that an etch chemistry exists for removing the first elemental semiconductor material selective to the second elemental semiconductor material. For example, the first elemental semiconductor material can be silicon and the second elemental semiconductor material can be a silicon germanium alloy. In another example, the first elemental semiconductor material can be a silicon germanium alloy and the second elemental semiconductor material can be silicon. In yet another example, the first elemental semiconductor material can be germanium and the second elemental semiconductor material can be a silicon germanium alloy. In still another example, the first elemental semiconductor material can be a silicon germanium alloy and the second elemental semiconductor material can be germanium. In even another example, the first and second elemental semiconductor materials can be silicon germanium alloys having different atomic concentrations of germanium such that the first elemental semiconductor material can be removed without substantially etching the second elemental semiconductor material.

In another embodiment, the first template semiconductor material of the first template epitaxial semiconductor material portion 30 is a first compound semiconductor material and the first semiconductor material of the first epitaxial semiconductor portion 60 is a second compound semiconductor material that is different from the first compound semiconductor material. The first and second compound semiconductor materials are selected such that a known etch chemistry exists for removing the first compound semiconductor material selective to the second compound semiconductor material.

The first epitaxial semiconductor portion 60 can be formed with epitaxial alignment with the single crystalline structure of the first template epitaxial semiconductor material portion 30. Surfaces of the first epitaxial semiconductor portion 60 can include crystallographic facets, one of which can be a horizontal top surface. The thickness of the first epitaxial semiconductor portion 60 is defined as the maximum dimension between the planar bottom surface of the first epitaxial semiconductor portion 60 and the topmost surface of the first epitaxial semiconductor portion 60, and is herein referred to as a first thickness t1. The first thickness t1 can be in a range from 3 nm to 1,000 nm, although lesser and greater thicknesses can also be employed.

Figure 16:
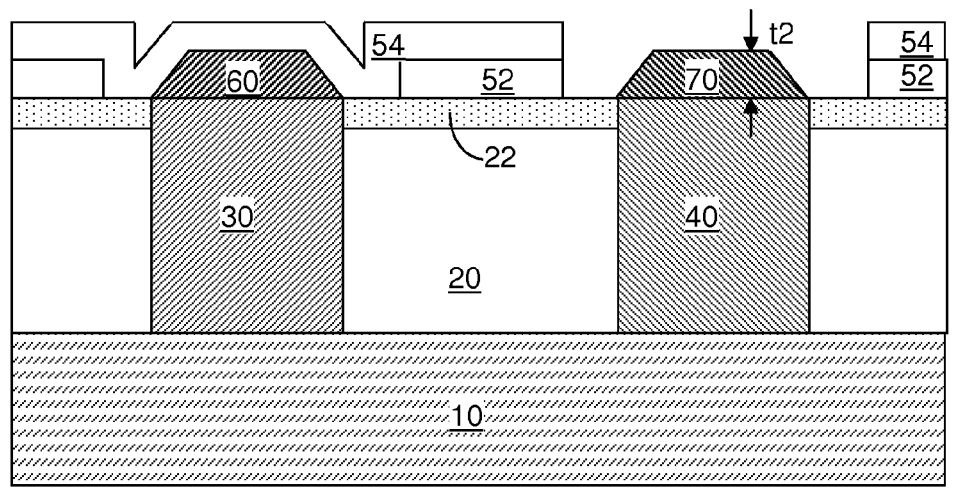
FIG. 16 is a vertical cross-sectional view of the first exemplary semiconductor structure after deposition and patterning of a second dielectric bonding material layer and formation of a second epitaxial semiconductor portion according to the first embodiment of the present disclosure.

Referring to FIG. 16, a second dielectric bonding material layer 54 is deposited and patterned to provide an opening over the second template epitaxial semiconductor material portion 40. A portion of the first dielectric bonding material layer 52 overlying the second template epitaxial semiconductor material portion 40 is subsequently removed, for example, employing the same etch mask that is employed to pattern the second dielectric bonding material layer 54. The second dielectric bonding material layer 54 includes a dielectric material that can provide sufficient adhesion to the first semiconductor material of the first epitaxial semiconductor portion 60 to prevent detachment of the first semiconductor material. In one embodiment, the second dielectric bonding material layer 54 can include an undoped silicon oxide material (such as undoped silicate glass (USG)), a doped semiconductor oxide material (such as borophosphosilicate glass, borosilicate glass, phosphosilicate glass, fluorosilicate glass, etc.), a spin-on glass (SOG) material, or a combination thereof. The thickness of the second dielectric bonding material layer 54 can be from 3 nm to 300 nm, although lesser and greater thicknesses can also be employed. The composition of the second dielectric bonding material layer 54 may be the same as, or may be different from, the composition of the first dielectric bonding material layer 52.

The patterning of the second dielectric bonding material layer 54 is performed such that the first epitaxial semiconductor portion 60 is covered with the patterned second dielectric bonding material layer 54, and a top surface of the second template epitaxial semiconductor material portion 40 is physically exposed. A second epitaxial semiconductor portion 70 is deposited directly on the second template epitaxial semiconductor material portion 60 employing a selective epitaxy process. The selective epitaxy deposits a second semiconductor material on the top surface of the second template epitaxial semiconductor material portion 60. The second semiconductor material is different from the second template semiconductor material of the second template epitaxial semiconductor material portion 60.

In one embodiment, the first template semiconductor material of the first template epitaxial semiconductor material portion 30 is a first elemental semiconductor material, the first semiconductor material of the first epitaxial semiconductor portion 60 is a second elemental semiconductor material that is different from the first elemental semiconductor material, the second template semiconductor material of the second template epitaxial semiconductor material portion 40 is a first compound semiconductor material, and the second semiconductor material of the second epitaxial semiconductor portion 70 is a second compound semiconductor material that is different from the first compound semiconductor material. The first and second compound semiconductor materials are selected such that a known etch chemistry exists for removing the first compound semiconductor material selective to the second compound semiconductor material.

In another embodiment, the first template semiconductor material of the first template epitaxial semiconductor material portion 30 is a first compound semiconductor material, the first semiconductor material of the first epitaxial semiconductor portion 60 is a second compound semiconductor material that is different from the first compound semiconductor material, the second template semiconductor material of the second template epitaxial semiconductor material portion 40 is a first elemental semiconductor material, the second semiconductor material of the second epitaxial semiconductor portion 70 is a second elemental semiconductor material that is different from the first elemental semiconductor material. The first and second elemental semiconductor materials are selected such that a known etch chemistry exists for removing the first elemental semiconductor material selective to the second elemental semiconductor material.

The second epitaxial semiconductor portion 70 can be formed with epitaxial alignment with the single crystalline structure of the second template epitaxial semiconductor material portion 40. Surfaces of the second epitaxial semiconductor portion 70 can include crystallographic facets, one of which can be a horizontal top surface. The thickness of the second epitaxial semiconductor portion 70 is defined as the maximum dimension between the planar bottom surface of the second epitaxial semiconductor portion 70 and the topmost surface of the second epitaxial semiconductor portion 70, and is herein referred to as a second thickness t2. The second thickness t2 can be in a range from 3 nm to 1,000 nm, although lesser and greater thicknesses can also be employed. The second thickness t2 can be the same as, or can be different from, the first thickness t1.

Figure 17:
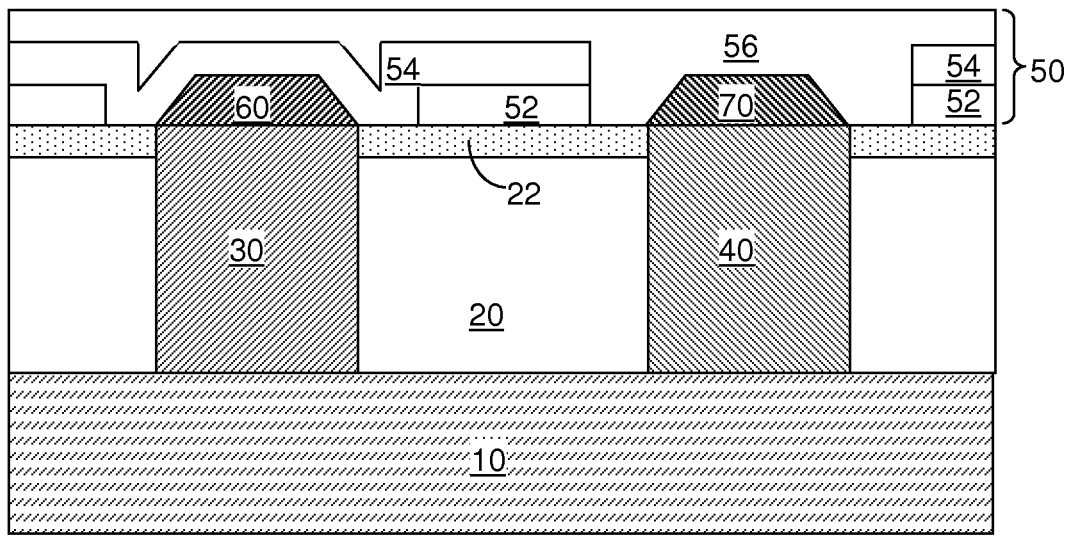
FIG. 17 is a vertical cross-sectional view of the first exemplary semiconductor structure after deposition and planarization of a third dielectric bonding material layer according to the first embodiment of the present disclosure.

Referring to FIG. 17, a third dielectric bonding material layer 56 is deposited and planarized over the second dielectric bonding material layer 54 and the second epitaxial semiconductor portion 70. The third dielectric bonding material layer 56 includes a dielectric material that can provide sufficient adhesion to the second semiconductor material to prevent detachment of the second semiconductor material. In one embodiment, the third dielectric bonding material layer 56 can include an undoped silicon oxide material (such as undoped silicate glass (USG)), a doped semiconductor oxide material (such as borophosphosilicate glass, borosilicate glass, phosphosilicate glass, fluorosilicate glass, etc.), a spin-on glass (SOG) material, or a combination thereof. The thickness of the third dielectric bonding material layer 56 can be from 3 nm to 300 nm, although lesser and greater thicknesses can also be employed. The composition of the third dielectric bonding material layer 56 may be the same as, or may be different from, the composition of the first dielectric bonding material layer 52, and may be the same as, or may be different from, the composition of the second dielectric bonding material layer 54. The third dielectric bonding material layer 56 may include a self-planarizing material such as SOG, or may be planarized after deposition, for example, by chemical mechanical planarization (CMP).

Optionally, each of the first and second dielectric bonding material layers (52, 54) may be removed prior to deposition of a next dielectric bonding material layer, i.e., prior to deposition of the second or third dielectric bonding material layers (54 or 56), respectively. Thus, one, two, or three dielectric bonding material layers may be present over the top surface of the dielectric hard mask layer 22. The entirety of the dielectric bonding material layers (52, 54, 56) is herein referred to as at least one dielectric bonding material layer 50.

Figure 18:
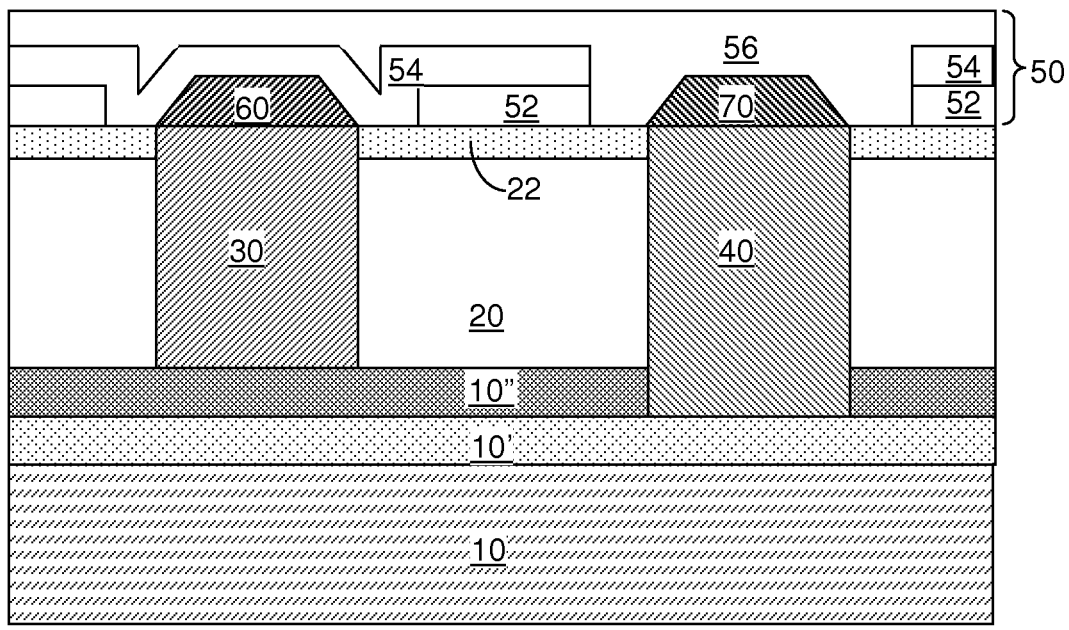
FIG. 18 is a vertical cross-sectional view of the first variation of the first exemplary semiconductor structure after deposition and planarization of a third dielectric bonding material layer according to the first embodiment of the present disclosure.

Referring to FIG. 18, the first variation of the first exemplary semiconductor structure (See FIGS. 3 and 4) is illustrated after deposition and planarization of the third dielectric bonding material layer 56.

Figure 19:
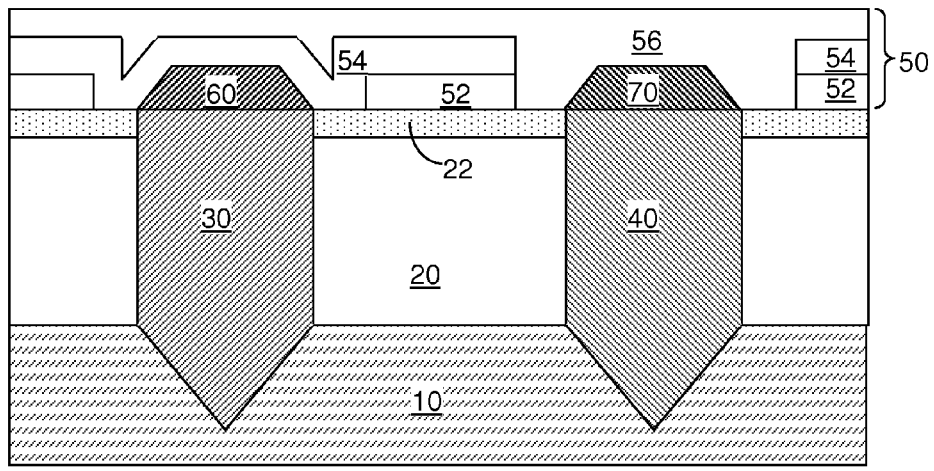
FIG. 19 is a vertical cross-sectional view of the second variation of the first exemplary semiconductor structure after deposition and planarization of a third dielectric bonding material layer according to the first embodiment of the present disclosure.

Referring to FIG. 19, the second variation of the first exemplary semiconductor structure (See FIG. 5) is illustrated after deposition and planarization of a third dielectric bonding material layer 56.

Figure 20:
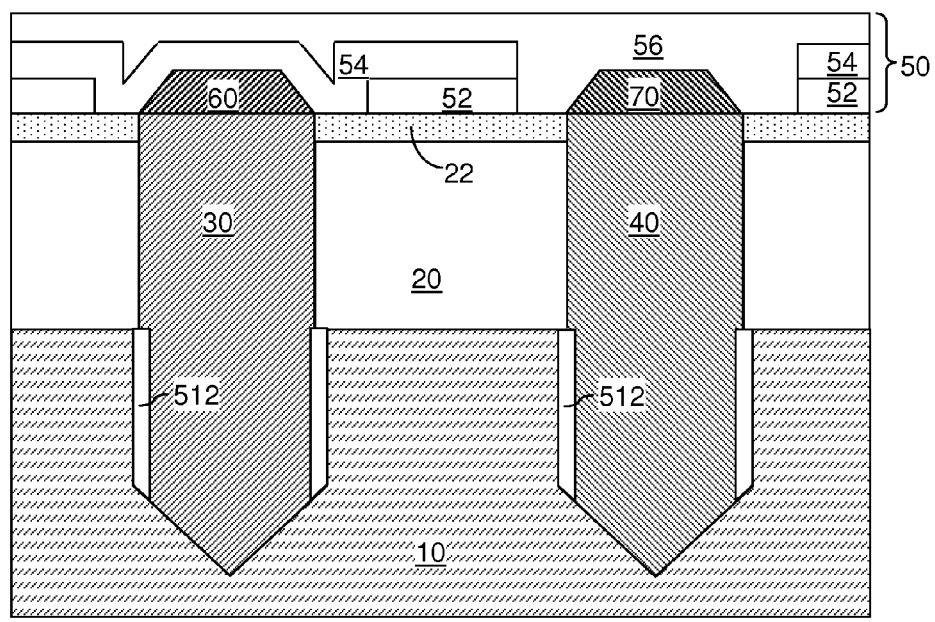
FIG. 20 is a vertical cross-sectional view of the third variation of the first exemplary semiconductor structure after deposition and planarization of a third dielectric bonding material layer according to the first embodiment of the present disclosure.

Referring to FIG. 20, the third variation of the first exemplary semiconductor structure (See FIGS. 6-8) is illustrated after deposition and planarization of a third dielectric bonding material layer 56.

Figure 21:
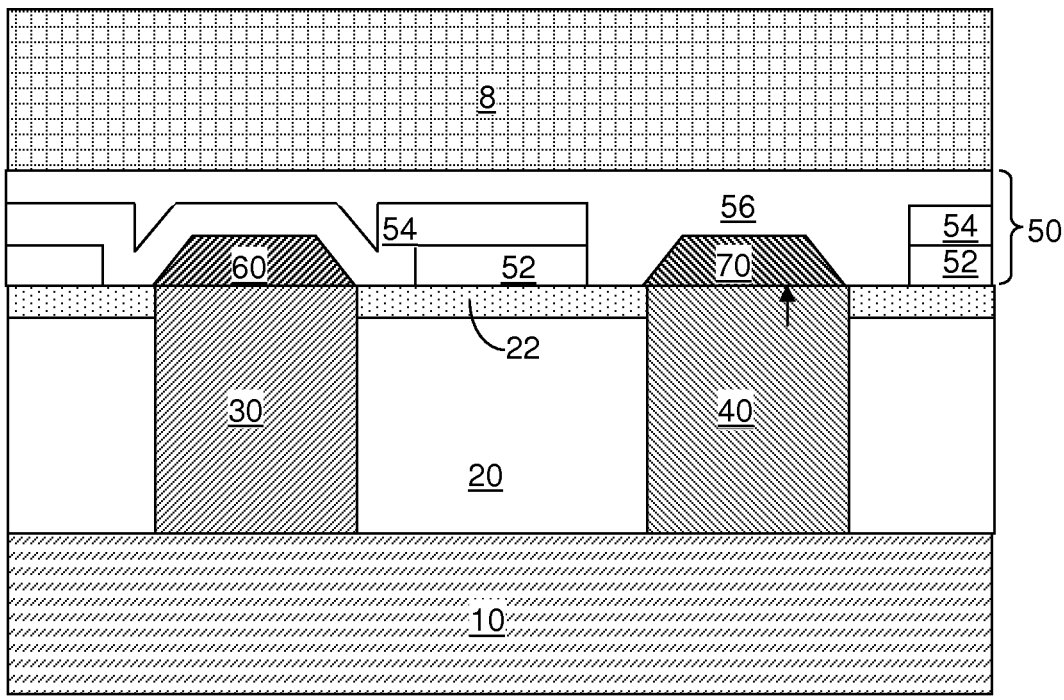
FIG. 21 is a vertical cross-sectional view of the first exemplary semiconductor structure after bonding a handle substrate to the at least one dielectric bonding material layer according to the first embodiment of the present disclosure.

Referring to FIG. 21, a handle substrate 8 is bonded to the at least one dielectric bonding material layer 50. The handle substrate 8 may be any of a bulk semiconductor substrate, a semiconductor-on-insulator substrate, a stack of at least two semiconductor material layers having different compositions and epitaxially aligned to one another, an insulator substrate, a metallic substrate, and a plastic substrate.

Figure 22:
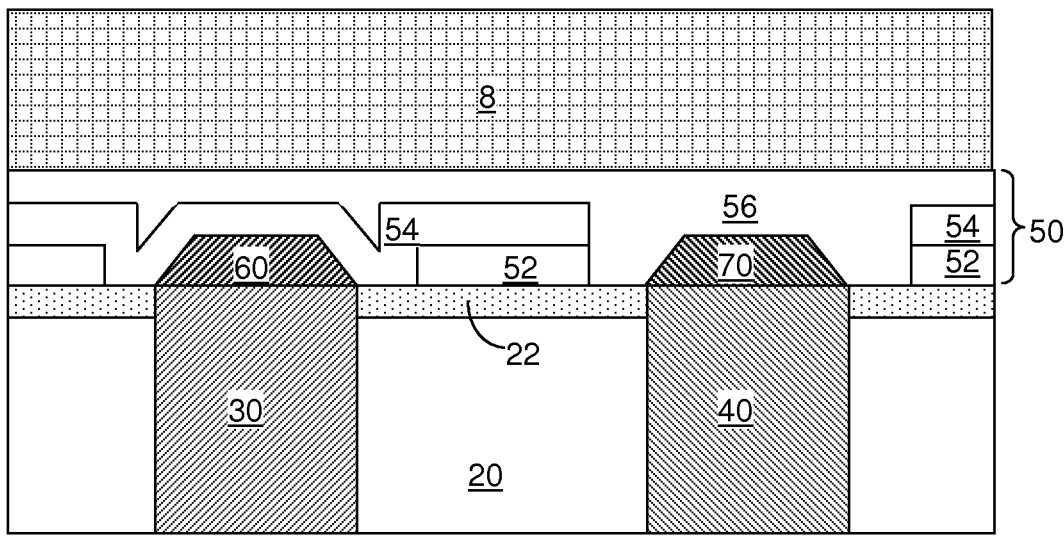
FIG. 22 is a vertical cross-sectional view of the first exemplary semiconductor structure after removal of the single crystalline substrate according to the first embodiment of the present disclosure.

Referring to FIG. 22, the single crystalline substrate 10 can be removed, for example, by grinding, polishing, etching, cleaving, smart-cut, or a combination thereof.

Figure 23:
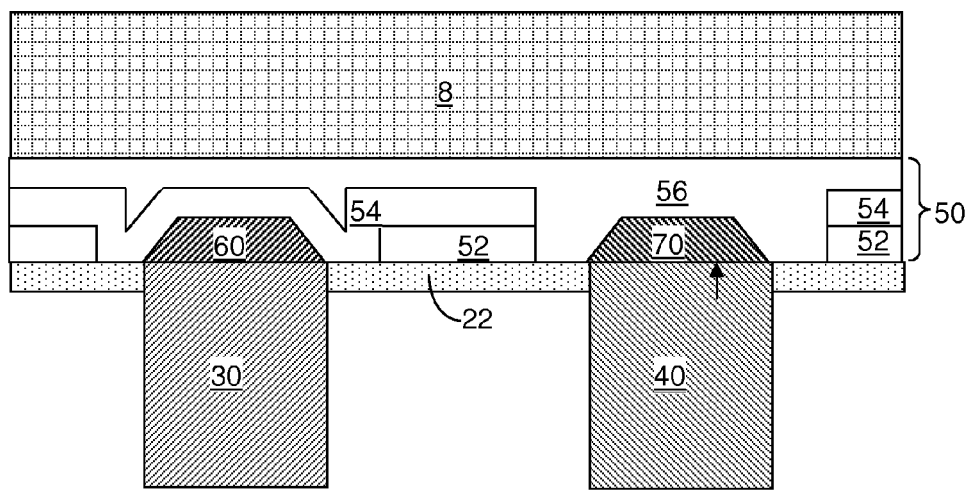
FIG. 23 is a vertical cross-sectional view of the first exemplary semiconductor structure after removal of the dielectric template material layer according to the first embodiment of the present disclosure.

Referring to FIG. 23, the dielectric template material layer 20 is removed, for example, by etching the dielectric template material layer 20 selective to the dielectric hard mask layer 22. For example, if the dielectric template material layer 20 includes silicon oxide and the dielectric hard mask layer 22 includes silicon nitride, the dielectric template material layer 20 can be removed by a wet etch employing hydrofluoric acid.

Figure 24:
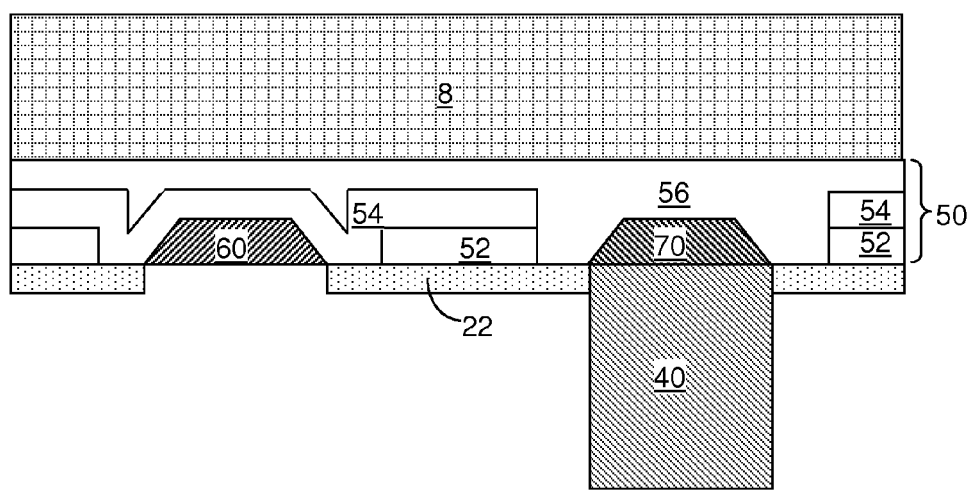
FIG. 24 is a vertical cross-sectional view of the first exemplary semiconductor structure after removal of the first template epitaxial semiconductor material portion according to the first embodiment of the present disclosure.

Referring to FIG. 24, the first template epitaxial semiconductor material portion 30 is removed selective to the first epitaxial semiconductor portion 60 employing an etch chemistry that etches the first template semiconductor material selective to the first semiconductor material of the first semiconductor material portion 60, i.e., without etching any substantial amount of the first semiconductor material.

Figure 25:
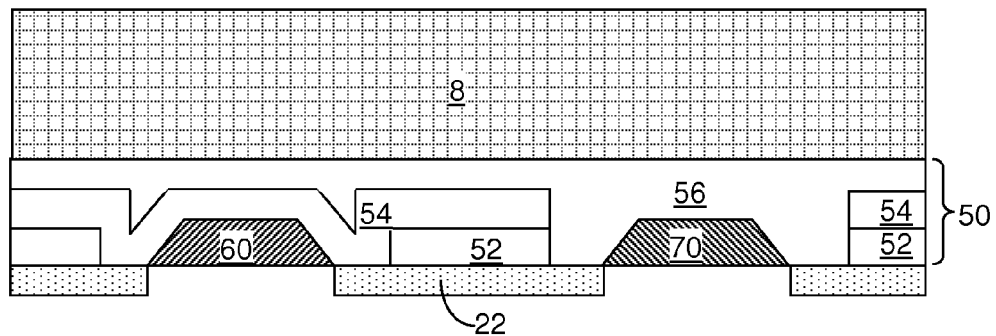
FIG. 25 is a vertical cross-sectional view of the first exemplary semiconductor structure after removal of the second template epitaxial semiconductor material portion according to the first embodiment of the present disclosure.

Referring to FIG. 25, the second template epitaxial semiconductor material portion 40 is removed selective to the second epitaxial semiconductor portion 70 employing an etch chemistry that etches the second template semiconductor material selective to the second semiconductor material of the second semiconductor material portion 70, i.e., without etching any substantial amount of the second semiconductor material.

Figure 26:
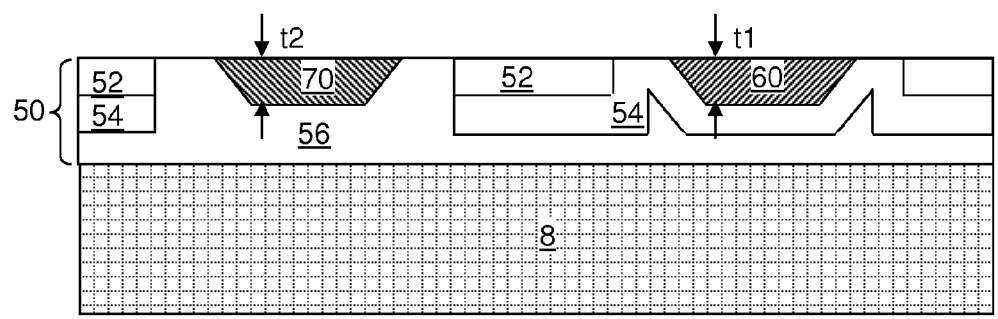
FIG. 26 is a vertical cross-sectional view of the first exemplary semiconductor structure after removal of the dielectric hard mask layer and flipping the first exemplary semiconductor structure upside down according to the first embodiment of the present disclosure.

Referring to FIG. 26, any remaining portion of the dielectric hard mask layer 22, if not removed during the processing steps of FIG. 24 or 25, can be removed selective to the first and second semiconductor materials and selective to the at least one dielectric bonding material layer 50. The first exemplary semiconductor structure can be flipped upside down.

In the first exemplary semiconductor structure of FIG. 26, the entirety of the first epitaxial semiconductor portion 60 and the entirety of the second epitaxial semiconductor portions 70 are embedded within the at least one dielectric bonding material layer 50. The first exemplary semiconductor structure includes at least one dielectric bonding material layer 50 located on a handle substrate 8, and a first epitaxial semiconductor portion 60 and a second epitaxial semiconductor portion 70. At least a lower portion of the first and second epitaxial semiconductor portions (60, 70) is embedded within the at least one bonding material layer 50. One of the first and second epitaxial semiconductor portions (60, 70) includes a single crystalline elemental semiconductor material, and another of the first and second epitaxial semiconductor portions (60, 70) includes a single crystalline compound semiconductor material.

Each of the first and second epitaxial semiconductor portions (60, 70) can have a bottommost surface that is a crystallographic facet. Surfaces of each of the first and second epitaxial semiconductor portions (60, 70) can include a plurality of angled crystallographic facets that are not horizontal and not vertical. All of the plurality of angled crystallographic facets can be in physical contact with surfaces of the at least one dielectric bonding material layer 50.

Each of the first and second epitaxial semiconductor portions (60, 70) has a topmost surface that is coplanar with a topmost surface of the at least one dielectric bonding material layer 50. Each of the first and second epitaxial semiconductor portions (60, 70) has a trapezoidal shape in a vertical cross-sectional view.

In one embodiment, the at least one dielectric bonding material layer 50 can include at least one silicon oxide layer. In one embodiment, the at least one dielectric bonding material layer 50 can include a plurality of dielectric bonding material layers having different compositions. The at least one dielectric bonding material layer 50 can include a first dielectric bonding material layer 52 not contacting the first and second epitaxial semiconductor portions (60, 70), and a second dielectric bonding material layer 54 underlying all of the first dielectric bonding material layer 52 and contacting the first epitaxial semiconductor portion 60. The at least one dielectric bonding material layer 50 can further include a third dielectric bonding material layer 56 underlying all of the first dielectric layer 52 and all of the second dielectric layer and contacting the second epitaxial semiconductor portion 70.

In one embodiment, the first dielectric bonding material layer 52 has a first composition, the second dielectric bonding material layer 54 has a second composition, and the third dielectric bonding material layer 56 has a third composition, and at least one of the first, second, and third compositions is different from another of the first, second, and third compositions, i.e., not all three compositions are the same.

Figure 27:
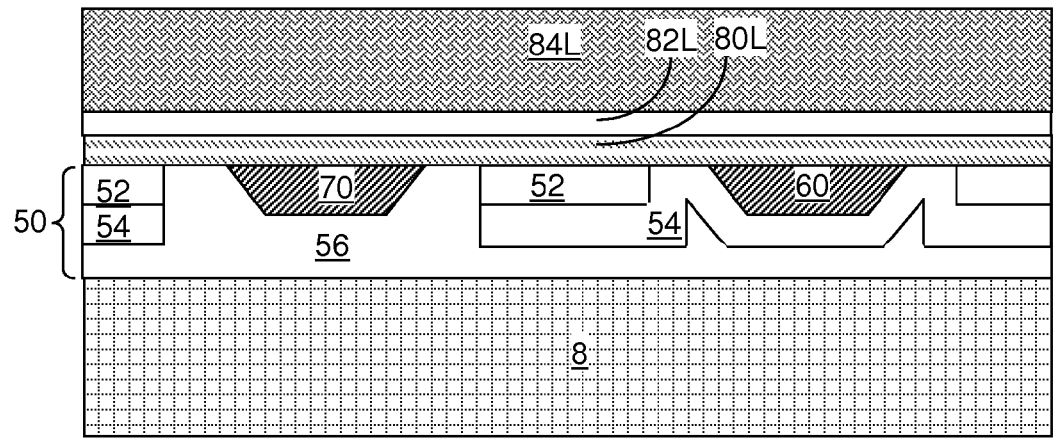
FIG. 27 is a vertical cross-sectional view of the first exemplary semiconductor structure after formation of a capping semiconductor material layer, a gate dielectric layer, and a gate electrode layer according to the first embodiment of the present disclosure.

Referring to FIG. 27, a capping semiconductor material layer 80L, a gate dielectric layer 82L, and a gate electrode layer 84L are sequentially deposited. The capping semiconductor material layer 80L is optional, and if employed, can provide protection to at least one of the first and second epitaxial semiconductor portions (60, 70). The capping semiconductor material layer 80L can include, for example, silicon, and can have a thickness from 1 nm to 10 nm, although lesser and greater thicknesses can also be employed. The gate dielectric layer 82L can include any gate dielectric material known in the art. The gate electrode layer 84L can include any conductive material known in the art, and may be selected so as to optimize the performance of semiconductor devices (such as field effect transistors) to be subsequently formed.

Figure 28:
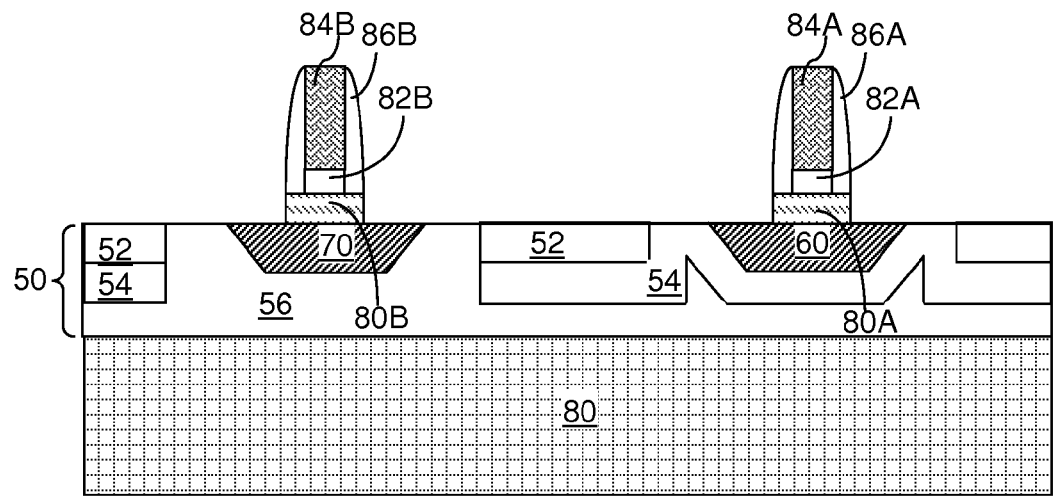
FIG. 28 is a vertical cross-sectional view of the first exemplary semiconductor structure after formation of gate electrodes, gate dielectrics, gate spacers, and capping semiconductor material portions according to the first embodiment of the present disclosure.

Referring to FIG. 28, gate electrodes, gate dielectrics, gate spacers, and capping semiconductor material portions can be formed. For example, a first gate stack including a first gate dielectric 82A and a first gate electrode 84A and a second gate stack including a second gate dielectric 82B and a second gate electrode 84B can be formed over the capping semiconductor material layer 80L. A first gate spacer 86A can be formed around the first gate stack (82A, 84A), and a second gate spacer 86B can be formed around the second gate stack (82B, 84B). The capping semiconductor material layer 80L can be subsequently formed so that first and second capping semiconductor material portions (80A, 80B) are formed. The first capping semiconductor material portion 80A can underlie the first gate stack (82A, 84A) and can overlie the first epitaxial semiconductor portion 60. The second capping semiconductor material portion 80B can underlie the second gate stack (82B, 84B) and can overlie the second epitaxial semiconductor portion 70.

Figure 29:
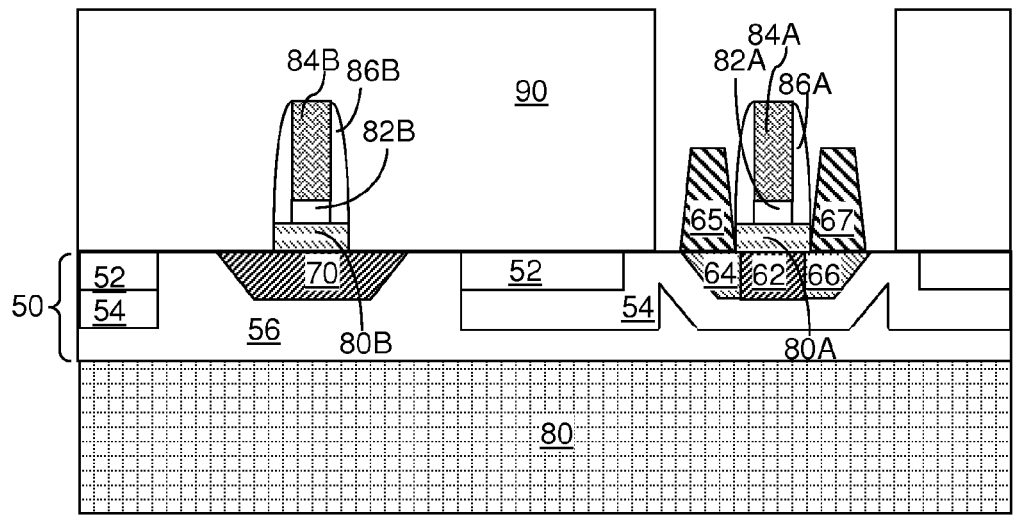
FIG. 29 is a vertical cross-sectional view of the first exemplary semiconductor structure after formation of a first field effect transistor according to the first embodiment of the present disclosure.

Referring to FIG. 29, a gate level dielectric layer 90 is deposited and patterned to expose an area of the first gate stack (82A, 84A) and the first epitaxial semiconductor portion 60. The gate level dielectric layer 90 includes a dielectric material such as silicon oxide, organosilicate glass, silicon nitride, or combinations thereof. A first body region 62, a first source region 64, and a first drain region 66 of a first field effect transistor are formed in the first epitaxial semiconductor portion 60, for example, by implantation of p-type dopants or n-type dopants employing the first gate stack (82A, 84A) and the first gate spacer 86A as a self-aligning implantation mask. Optionally, a first raised source region 65 and a first raised drain region 67 can be formed on the first source region 64 and the first drain region 66, respectively.

If the first body region 62, the first source region 64, and the first drain region 66 include an elemental semiconductor material, the first field effect transistor is an elemental semiconductor device. If the first body region 62, the first source region 64, and the first drain region 66 include a compound semiconductor material, the first field effect transistor is a compound semiconductor device. The first field effect transistor may be a p-type field effect transistor or an n-type field effect transistor. In general, at least one elemental semiconductor device (which may be a plurality of elemental semiconductor devices) or at least one compound semiconductor device (which may be a plurality of compound semiconductor devices) can be formed on the first epitaxial semiconductor portion 60 as provided at the processing step of FIG. 26.

Figure 30:
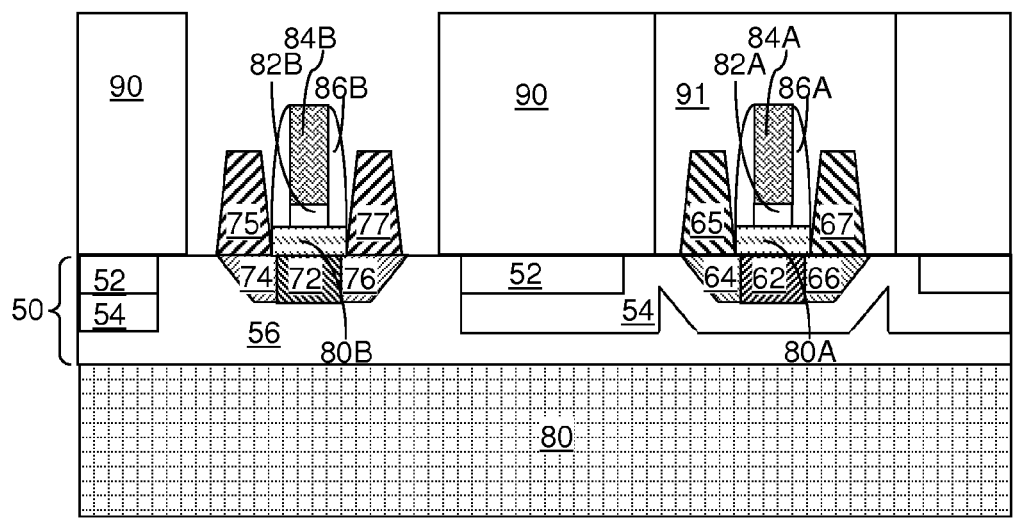
FIG. 30 is a vertical cross-sectional view of the first exemplary semiconductor structure after formation of a second field effect transistor according to the first embodiment of the present disclosure.

Referring to FIG. 30, a complementary dielectric material portion 91 may be deposited to cover the first field effect transistor, and the gate level dielectric layer 90 can be patterned to expose an area of the second gate stack (82B, 84B) and the second epitaxial semiconductor portion 70. A second body region 72, a second source region 74, and a second drain region 76 of a second field effect transistor are formed in the second epitaxial semiconductor portion 70, for example, by implantation of p-type dopants or n-type dopants employing the second gate stack (82B, 84B) and the second gate spacer 86B as a self-aligning implantation mask. Optionally, a second raised source region 75 and a second raised drain region 77 can be formed on the second source region 74 and the second drain region 76, respectively.

If the second body region 72, the second source region 74, and the second drain region 76 include an elemental semiconductor material, the second field effect transistor is an elemental semiconductor device. If the second body region 72, the second source region 74, and the second drain region 76 include a compound semiconductor material, the second field effect transistor is a compound semiconductor device. The second field effect transistor may be a p-type field effect transistor or an n-type field effect transistor. In general, at least one elemental semiconductor device (which may be a plurality of elemental semiconductor devices) or at least one compound semiconductor device (which may be a plurality of compound semiconductor devices) can be formed on the second epitaxial semiconductor portion 70 as provided at the processing step of FIG. 26.

In one embodiment, one of the first and second field effect transistors is a p-type field effect transistor, and another of the first and second field effect transistors is an n-type field effect transistor. A body region, a source region, and a drain region of the n-type field effect transistor includes the single crystalline compound semiconductor material, and a body region, a source region, and a drain region of the p-type field effect transistor includes the single crystalline elemental semiconductor material so as to provide optimal charge carrier mobility to the p-type field effect transistor and the n-type field effect transistor.

Figure 31:
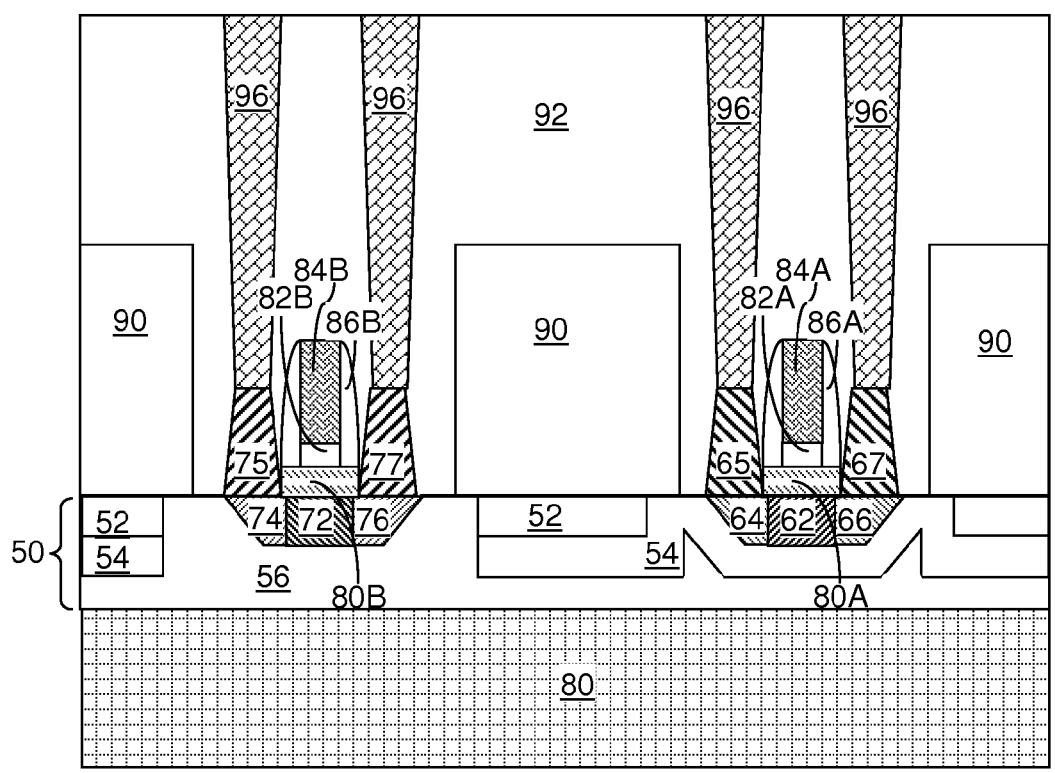
FIG. 31 is a vertical cross-sectional view of the first exemplary semiconductor structure after formation of a contact level dielectric layer and contact via structures therethrough according to the first embodiment of the present disclosure.

Referring to FIG. 31, a contact level dielectric layer 92 can be formed. The contact level dielectric layer 92 includes a dielectric material such as silicon oxide, silicon nitride, organosilicate glass, or a combination thereof. Contact via structures 96 are formed through the contact level dielectric layer 92 to provide electrical contact to various elements of the field effect transistors.

Figure 32:
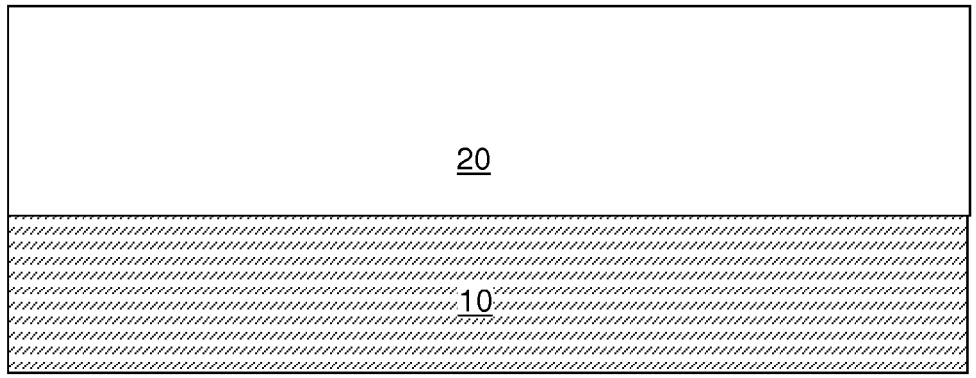
FIG. 32 is a vertical cross-sectional view of a second exemplary semiconductor structure after formation of a template dielectric material layer on a single crystalline substrate according to a second embodiment of the present disclosure.

Referring to FIG. 32, a second exemplary semiconductor structure is derived from the first exemplary structure of FIG. 1 by omitting formation of the dielectric hard mask layer 22.

Figure 33:
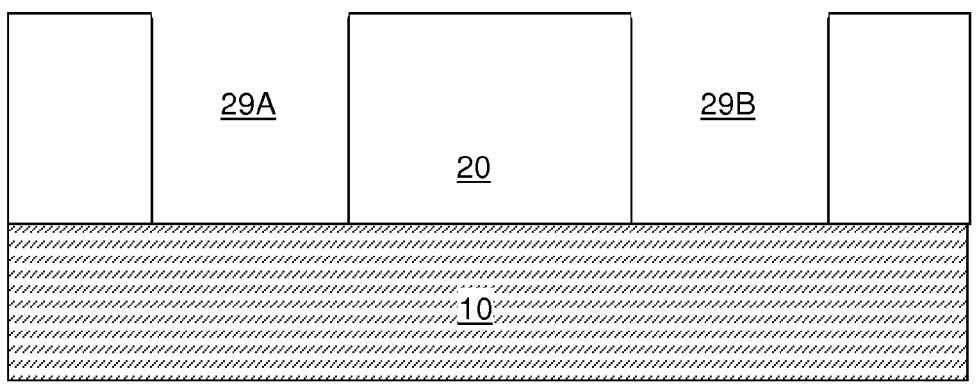
FIG. 33 is a vertical cross-sectional view of the second exemplary semiconductor structure after formation of a first trench and a second trench according to the second embodiment of the present disclosure.

Referring to FIG. 33, a first trench 29A and a second trench 29B are formed employing the same methods as the first embodiment or various variations thereof, while not employing a dielectric hard mask layer 22 illustrated in FIGS. 1-8.

Figure 34:
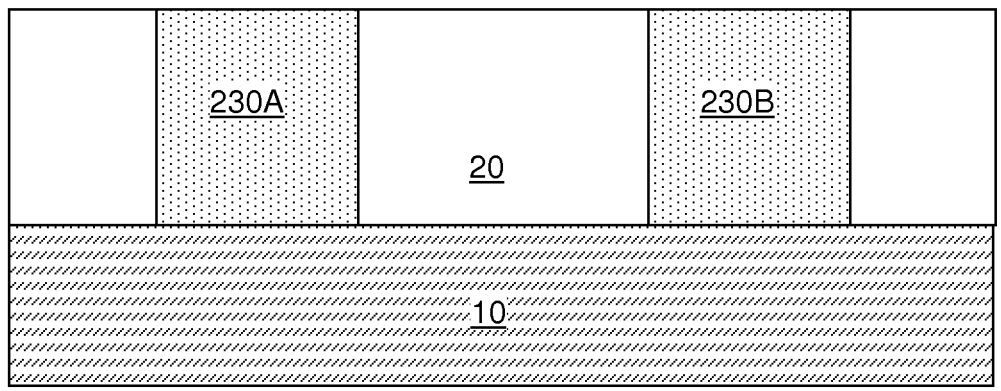
FIG. 34 is a vertical cross-sectional view of the second exemplary semiconductor structure after formation of disposable material portions according to the second embodiment of the present disclosure.

Referring to FIG. 34, a first disposable material portion 230A and a second disposable material portion 230B are formed in the first trench 29A and the second trench 29B, respectively. The first and second disposable material portions (230A, 230B) can be any disposable material that can be removed selective to the dielectric template material layer 20 and the single crystalline substrate 10 and disposable masking layers to be subsequently formed. For example, the disposable material of the disposable material portions (230A, 230B) can be silicon nitride, organosilicate glass, a semiconductor material that can be removed selective to the semiconductor material of the single crystalline substrate 10, or a metallic material. The first and second disposable material portions (230A, 230B) can be formed, by depositing the disposable material, for example, by chemical vapor deposition (CVD) or by spin coating, and by removing portions of the disposable material from above the top surface of the dielectric template material layer 20 by chemical mechanical planarization (CMP). The first disposable material portion 230A and the second disposable material portion 230B are formed concurrently within the first trench 29A and the second trench 29B, respectively.

Figure 35:
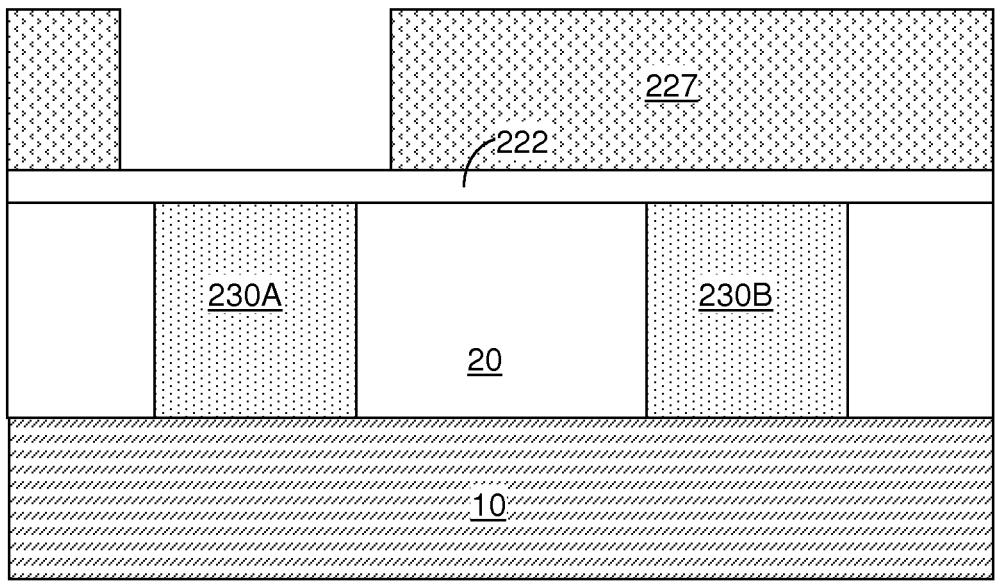
FIG. 35 is a vertical cross-sectional view of the second exemplary semiconductor structure after formation of a first disposable masking layer and a first patterned photoresist layer according to the second embodiment of the present disclosure.

Referring to FIG. 35, a first disposable masking layer 222 is formed over the dielectric template layer 20. The first disposable masking layer 222 includes a material that is different from the disposable material of the disposable material portions (230A, 230B). For example, the first disposable masking layer 222 can include silicon oxide, a dielectric metal oxide, or a dielectric metal nitride. The thickness of the first disposable masking layer 222 can be from 3 nm to 60 nm, although lesser and greater thicknesses can also be employed. A first patterned photoresist layer 227 is formed over the first disposable masking layer 222. The first patterned photoresist layer 227 includes an opening that overlies the first disposable material portion 230A.

Figure 36:
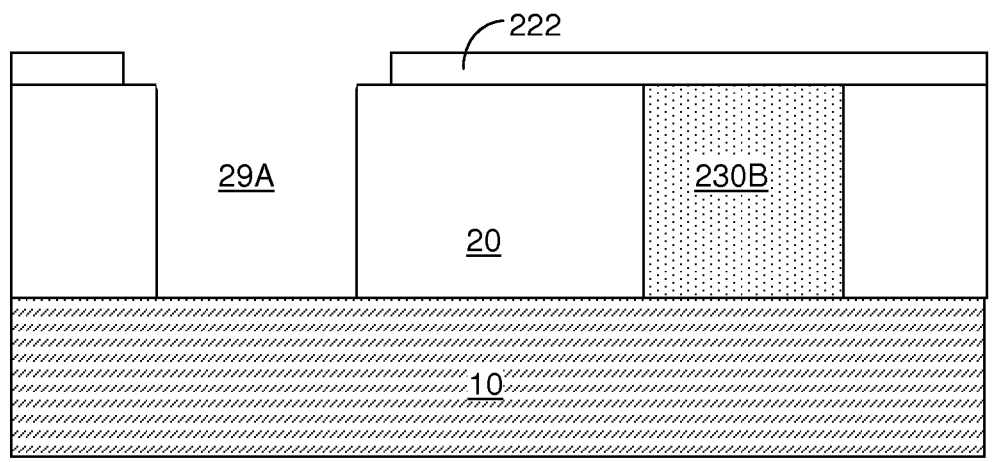
FIG. 36 is a vertical cross-sectional view of the second exemplary semiconductor structure after etching physically exposed portions of the first disposable masking layer and removal of one of the disposable material portions according to the second embodiment of the present disclosure.

Referring to FIG. 36, physically exposed portions of the first disposable masking layer 222 are removed, for example, by etching. The first disposable material portion 230A is removed from within the first cavity 29A employing an etch chemistry that etches the disposable material of the first disposable material portion 230A selective to the dielectric template material layer 20 and the first disposable masking layer 222.

Figure 37:
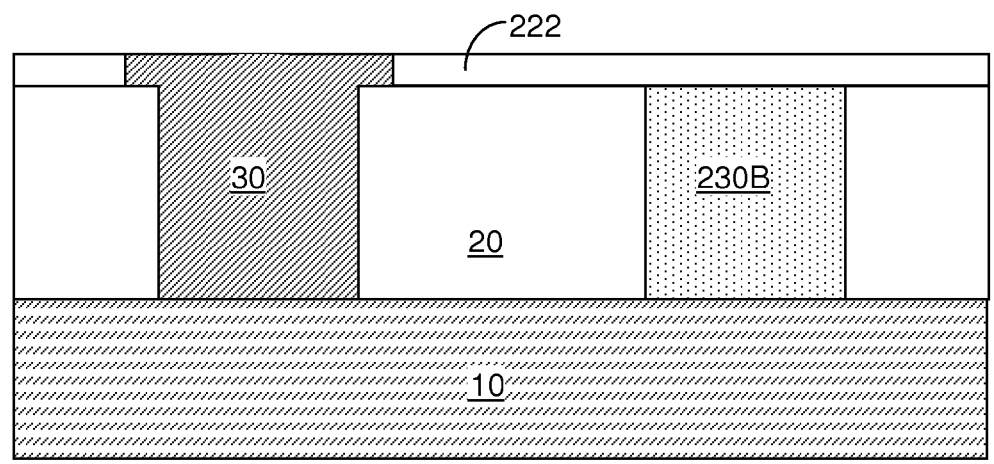
FIG. 37 is a vertical cross-sectional view of the second exemplary semiconductor structure after formation of a first template epitaxial semiconductor material portion according to the second embodiment of the present disclosure.

Referring to FIG. 37, the processing steps of FIGS. 9 and 10 are performed while the first disposable masking layer 222 provides the function of the dielectric masking layer 22 of the first embodiment to prevent nucleation of any semiconductor material thereupon. A first template epitaxial semiconductor material portion 30 is formed within the first trench 29A.

Because of the presence of the dielectric masking layer 22 over the second disposable material portion, a second template epitaxial semiconductor material portion is not formed at this step in contrast with the first embodiment.

Figure 38:
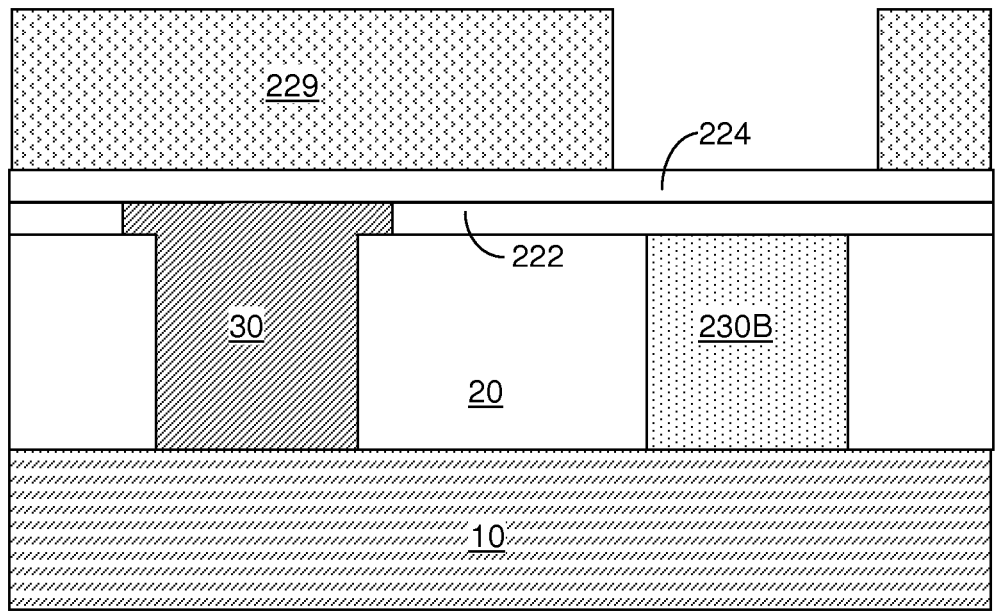
FIG. 38 is a vertical cross-sectional view of the second exemplary semiconductor structure after formation of a second disposable masking layer and a second patterned photoresist layer according to the second embodiment of the present disclosure.

Referring to FIG. 38, a second disposable masking layer 224 is formed over the first disposable masking layer 222 and the first template epitaxial semiconductor material portion 30. The second disposable masking layer 224 includes a material that is different from the disposable material of the second disposable material portion 230B. For example, the second disposable masking layer 224 can include silicon nitride, silicon oxynitride, or silicon oxide. The thickness of the second disposable masking layer 224 can be from 3 nm to 60 nm, although lesser and greater thicknesses can also be employed. A second patterned photoresist layer 229 is formed over the second disposable masking layer 224. The second patterned photoresist layer 229 includes an opening that overlies the second disposable material portion 230B.

Figure 39:
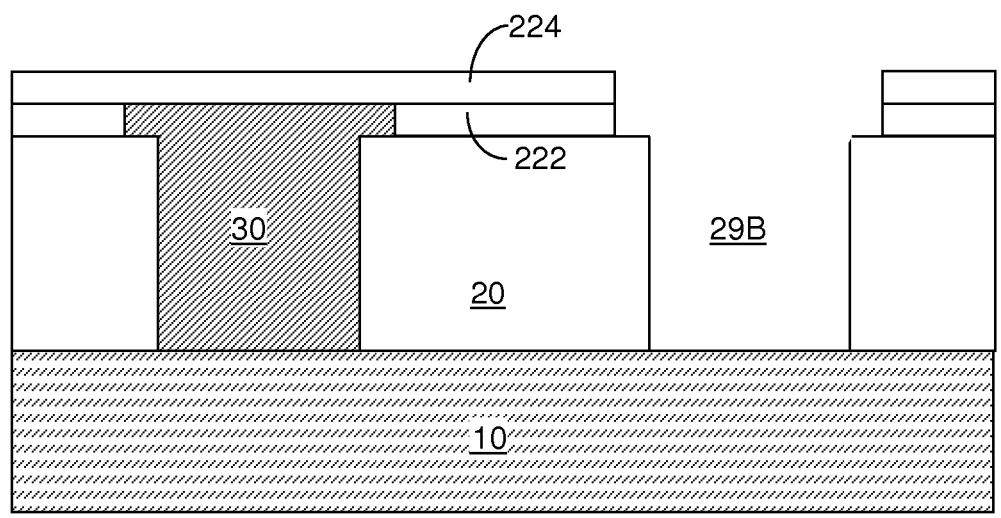
FIG. 39 is a vertical cross-sectional view of the second exemplary semiconductor structure after etching physically exposed portions of the first and second disposable masking layers and removal of another of the disposable material portions according to the second embodiment of the present disclosure.

Referring to FIG. 39, physically exposed portions of the second disposable masking layer 224 are removed, for example, by etching. The second disposable material portion 230B is removed from within the second cavity 29B employing an etch chemistry that etches the disposable material of the second disposable material portion 230B selective to the dielectric template material layer 20 and the second disposable masking layer 224.

Figure 40:
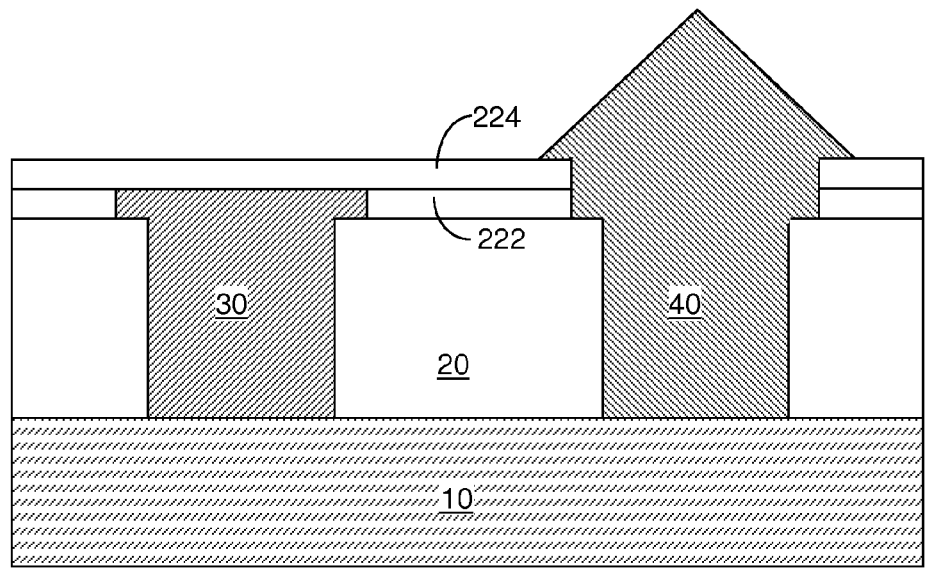
FIG. 40 is a vertical cross-sectional view of the second exemplary semiconductor structure after formation of a second template epitaxial semiconductor material portion according to the second embodiment of the present disclosure.

Referring to FIG. 40, the processing steps of FIG. 13 are performed while the second disposable masking layer 224 provides the function of the disposable masking layer 24 of the first embodiment to prevent nucleation of any semiconductor material thereupon. A second template epitaxial semiconductor material portion 40 is formed within the second trench 29B at this step.

Figure 41:
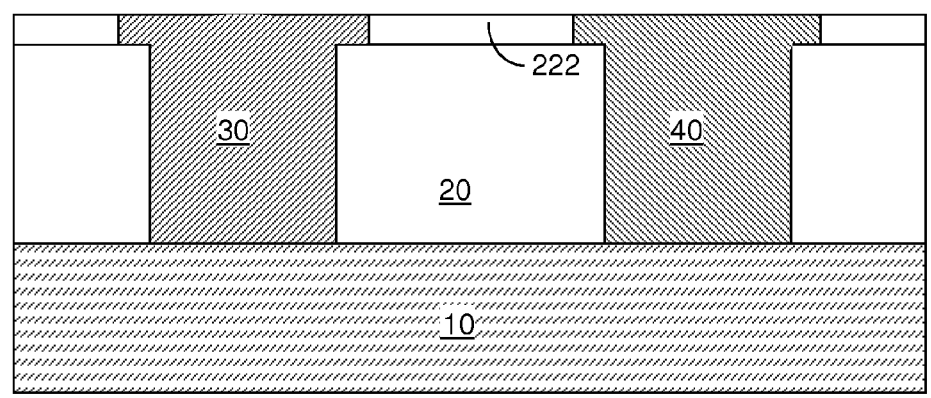
FIG. 41 is a vertical cross-sectional view of the second exemplary semiconductor structure after planarization of the first and second template epitaxial semiconductor material portions according to the second embodiment of the present disclosure.

Referring to FIG. 41, the processing steps of FIG. 14 are performed to remove portions of the second template epitaxial semiconductor material portion 40 and the second disposable masking layer 224 from above the top surface of the first disposable masking layer 222, for example, by chemical mechanical planarization. The first disposable masking layer 222 can function as a stopping layer during the planarization process.

The processing steps of FIGS. 15-31 can be performed such that the first disposable masking layer 222 provides the same function as the dielectric hard mask layer 22 of the first embodiment.

Figure 42:
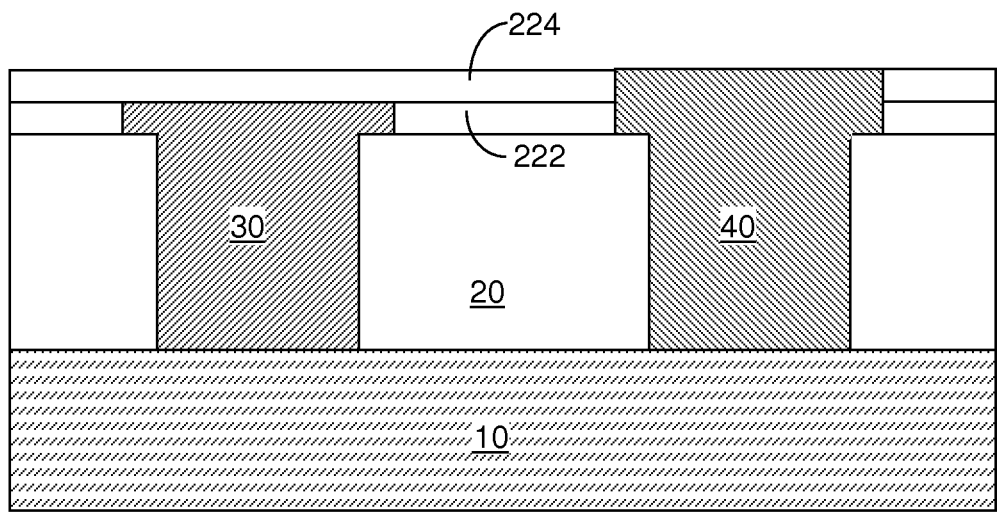
FIG. 42 is a vertical cross-sectional view of a third exemplary semiconductor structure after planarization of the second template epitaxial semiconductor material portions according to a third embodiment of the present disclosure.

Referring to FIG. 42, a third exemplary semiconductor structure can be derived from the second exemplary semiconductor structure of FIG. 40 by performing a planarization process employing the second disposable masking layer 224 as a stopping layer during the planarization process. The second template epitaxial semiconductor material portion 40 is removed from above the topmost surface of the second disposable masking layer 224. The top surface of the second template epitaxial semiconductor material portion 40 is coplanar with the top surface of the second disposable masking layer 224 after the planarization process.

Figure 43:
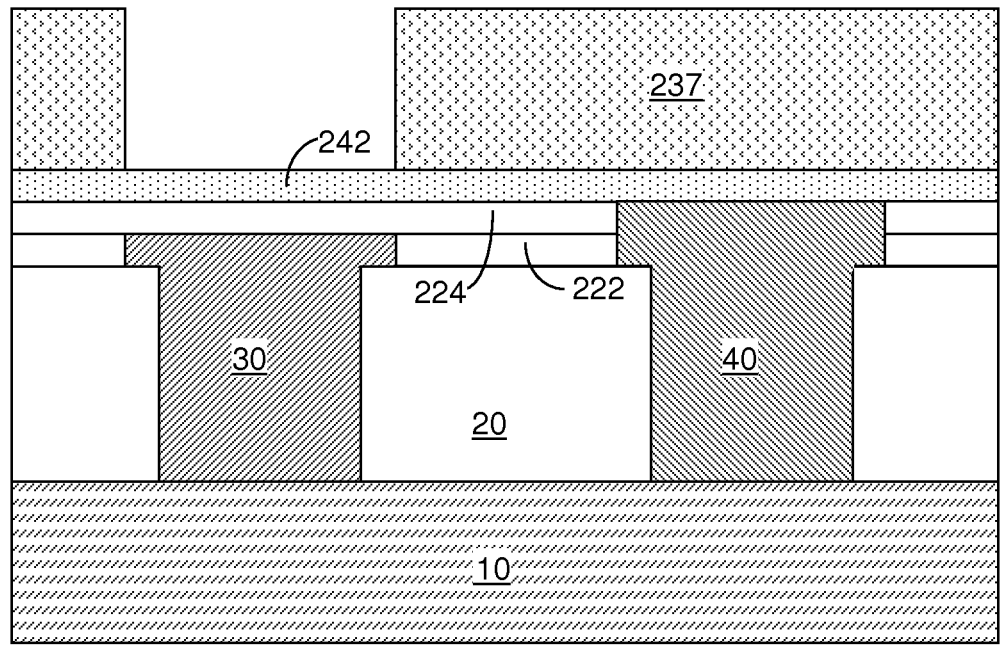
FIG. 43 is a vertical cross-sectional view of a third exemplary semiconductor structure after formation of a dielectric hard mask layer and a patterned photoresist layer according to the third embodiment of the present disclosure.

Referring to FIG. 43, a dielectric masking layer 242 is formed over the second disposable masking layer 224 and the second template epitaxial semiconductor material portion 40. The dielectric masking layer 242 includes a material that is different from the second disposable masking layer. For example, the first disposable masking layer 222 can include silicon oxide, a dielectric metal oxide, or a dielectric metal nitride. The thickness of the dielectric masking layer 242 can be from 3 nm to 60 nm, although lesser and greater thicknesses can also be employed. A patterned photoresist layer 237 is formed over the dielectric masking layer 242. The patterned photoresist layer 237 includes an opening that overlies the first template epitaxial semiconductor material portion 30.

Figure 44:
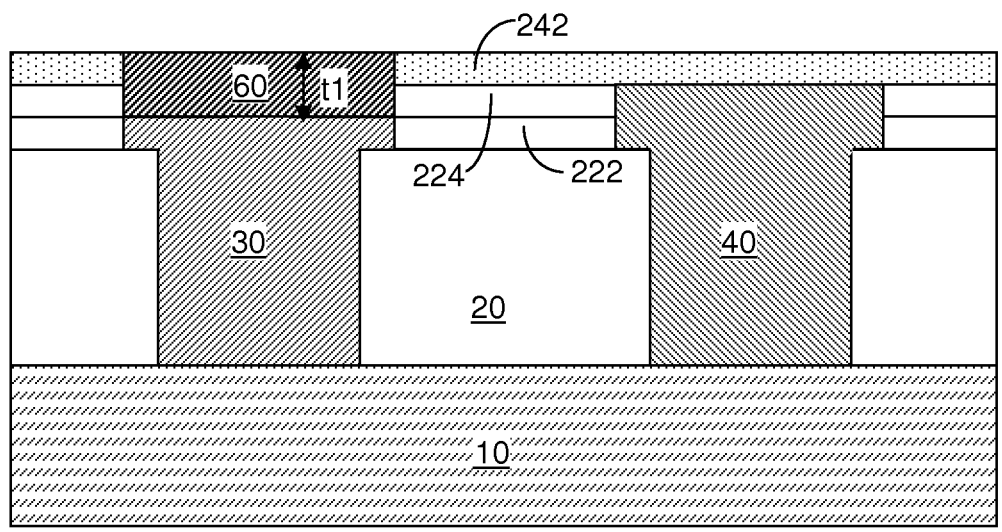
FIG. 44 is a vertical cross-sectional view of a third exemplary semiconductor structure after removal of physically exposed portions of the dielectric hard mask layer and the second disposable masking layer and formation of a first epitaxial semiconductor portion according to the third embodiment of the present disclosure.

Referring to FIG. 44, portions of the dielectric masking layer 242 and the second disposable masking layer 224 within the area of the opening in the patterned photoresist layer 237 is removed, for example, by an etch. The patterned photoresist layer 237 is subsequently removed, for example, by ashing.

A first epitaxial semiconductor portion 60 is deposited directly on the first template epitaxial semiconductor material portion 30 employing a selective epitaxy process. A first semiconductor material is epitaxially deposited on the top surface of the first template epitaxial semiconductor material portion 30. The first semiconductor material is different from the first template semiconductor material of the first template epitaxial semiconductor material portion 30. In one embodiment, the selective epitaxy process can be the same as in the processing step of FIG. 15 of the first embodiment. The selection of the first template semiconductor material and the first semiconductor material, the epitaxial alignment therebetween, and the lattice matching or lattice mismatch therebetween can be the same as in the first embodiment.

In one embodiment, the first epitaxial material can be deposited above the top surface of the dielectric masking layer 242, and subsequently planarized such that the top surface of the first epitaxial semiconductor portion 60 is coplanar with the top surface of the dielectric masking layer 242. In this case, the thickness of the first epitaxial semiconductor portion 60, which is herein referred to as the first thickness t1, can be the same as the sum of the thickness of the dielectric masking layer 242 and the thickness of the second disposable masking layer 224.

Figure 45:
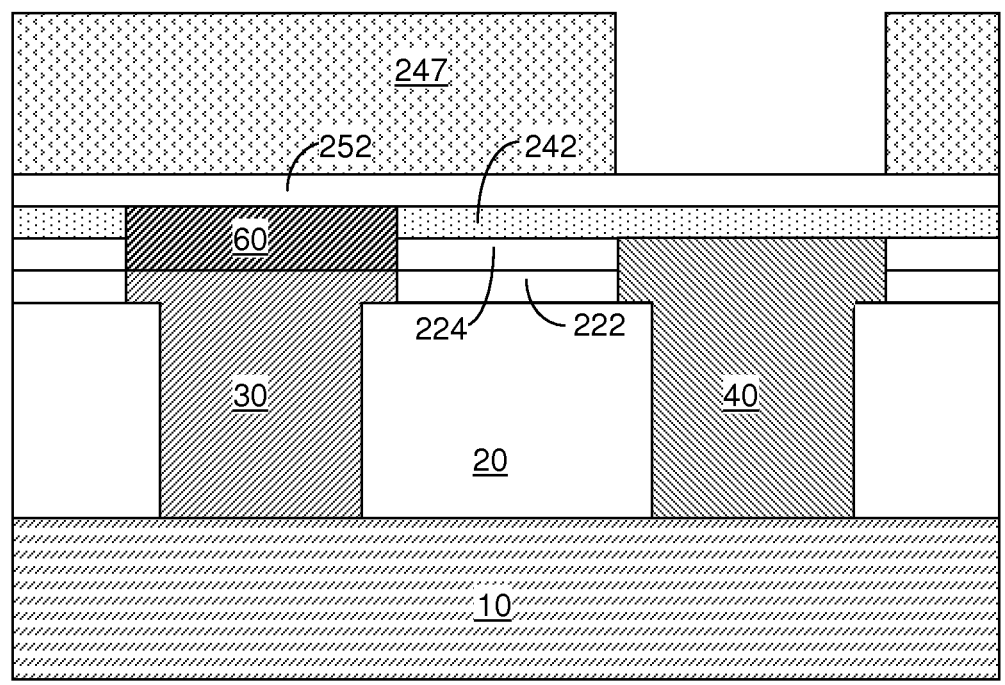
FIG. 45 is a vertical cross-sectional view of a third exemplary semiconductor structure after formation of a first dielectric bonding material layer and a patterned photoresist layer according to the third embodiment of the present disclosure.

Referring to FIG. 45, a first dielectric bonding material layer 252 is deposited on the dielectric masking layer 242 and the first epitaxial semiconductor portion 60. The first dielectric bonding material layer 252 includes a dielectric material that can provide sufficient adhesion to the first semiconductor material of the first epitaxial semiconductor portion 60 so as to prevent detachment of the first semiconductor material. In one embodiment, the first dielectric bonding material layer 252 can include an undoped silicon oxide material (such as undoped silicate glass (USG)), a doped semiconductor oxide material (such as borophosphosilicate glass, borosilicate glass, phosphosilicate glass, fluorosilicate glass, etc.), a spin-on glass (SOG) material, or a combination thereof. The thickness of the first dielectric bonding material layer 252 can be from 3 nm to 300 nm, although lesser and greater thicknesses can also be employed.

Another patterned photoresist layer 247 is formed over the first dielectric bonding material layer 252. The patterned photoresist layer 247 includes an opening that overlies the second template epitaxial semiconductor material portion 40.

Figure 46:
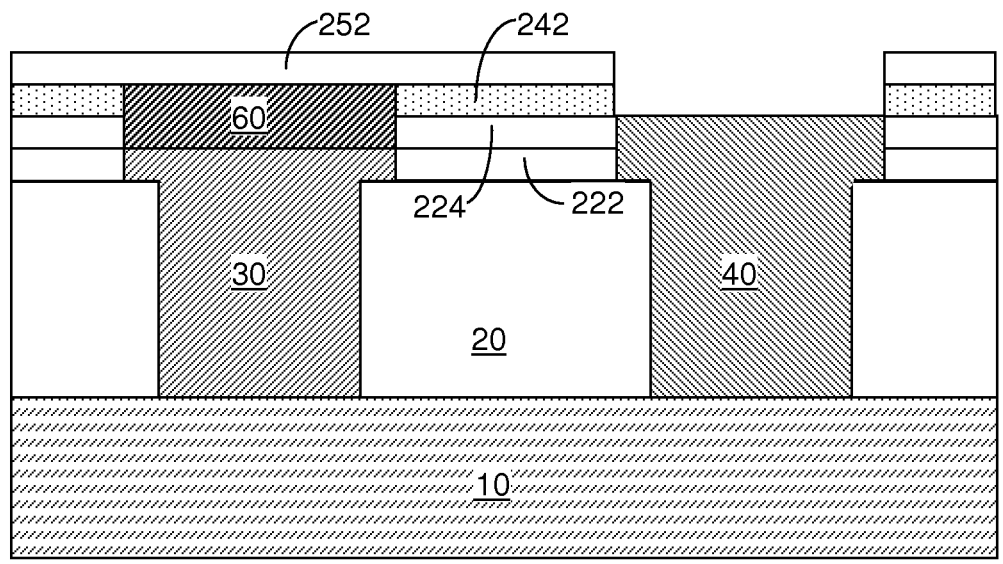
FIG. 46 is a vertical cross-sectional view of a third exemplary semiconductor structure after removal of physically exposed portions of the first dielectric bonding material layer and the dielectric hard mask layer according to the third embodiment of the present disclosure.
Figure 47:
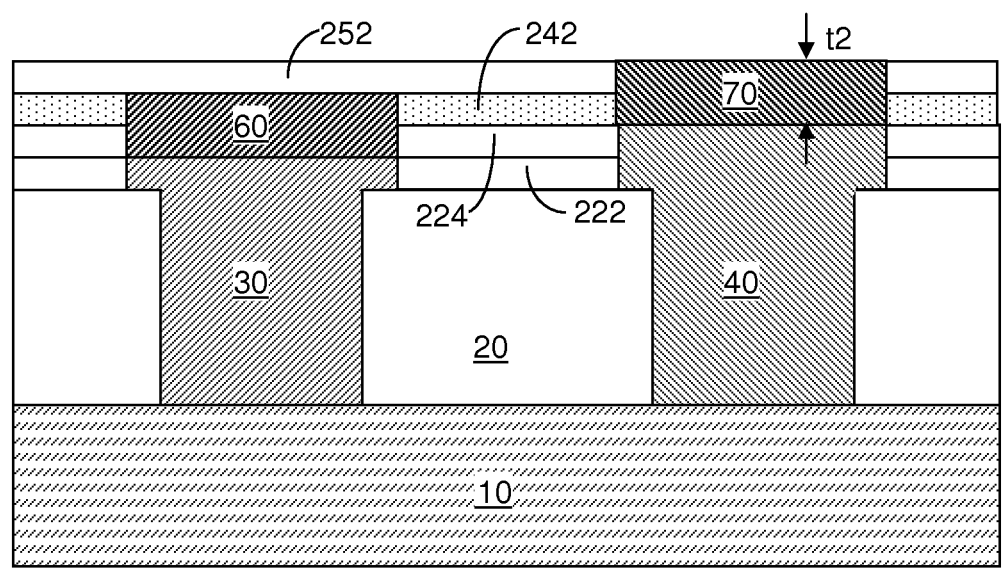
FIG. 47 is a vertical cross-sectional view of a third exemplary semiconductor structure after formation of a first epitaxial semiconductor portion according to the third embodiment of the present disclosure.

Referring to FIG. 46, portions of the first dielectric bonding material layer 252 and the dielectric masking layer 242 within the area of the opening in the patterned photoresist layer 247 is removed, for example, by an etch. The patterned photoresist layer 247 is subsequently removed, for example, by ashing.

A second epitaxial semiconductor portion 70 is deposited directly on the second template epitaxial semiconductor material portion 40 employing a selective epitaxy process. A second semiconductor material is epitaxially deposited on the top surface of the second template epitaxial semiconductor material portion 40. The second semiconductor material is different from the second template semiconductor material of the second template epitaxial semiconductor material portion 30, and is different from the first semiconductor material of the first epitaxial semiconductor portion 60. In one embodiment, the selective epitaxy process can be the same as in the processing step of FIG. 16 of the first embodiment. The selection of the second template semiconductor material and the second semiconductor material, the epitaxial alignment therebetween, and the lattice matching or lattice mismatch therebetween can be the same as in the first embodiment.

In one embodiment, the second epitaxial material can be deposited above the top surface of the first dielectric bonding material layer 252, and subsequently planarized such that the top surface of the second epitaxial semiconductor portion 60 is coplanar with the top surface of the first dielectric bonding material layer 252. In this case, the thickness of the second epitaxial semiconductor portion 70, which is herein referred to as the second thickness t2, can be the same as the sum of the thickness of the first dielectric bonding material layer 252 and the thickness of the dielectric masking layer 242.

Figure 48:
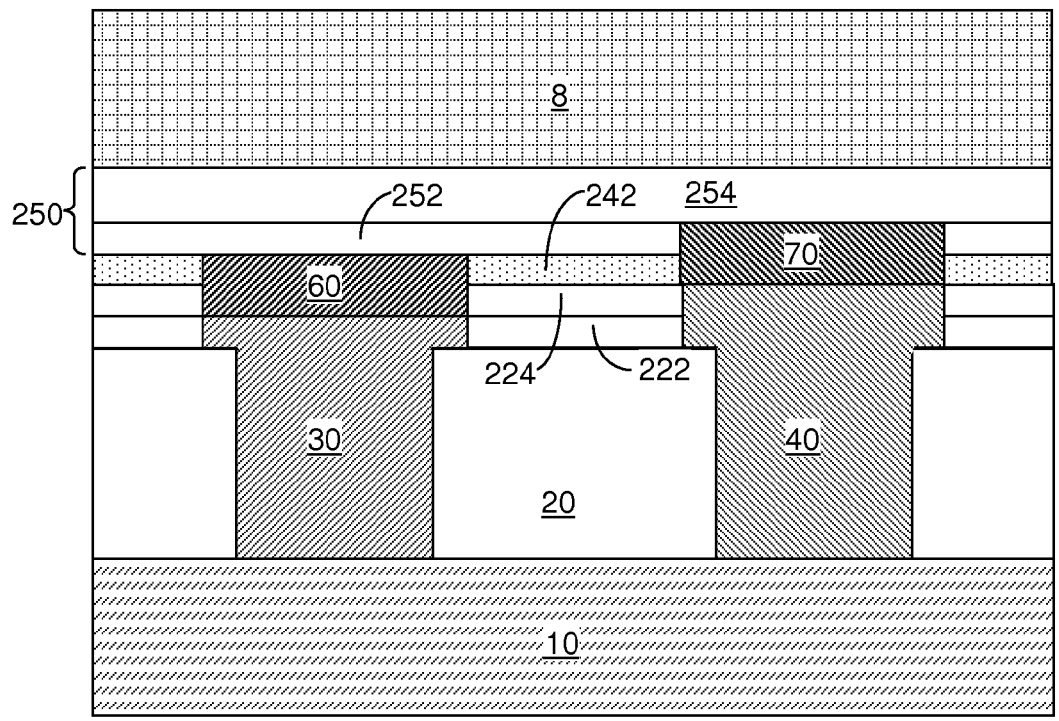
FIG. 48 is a vertical cross-sectional view of the third exemplary semiconductor structure after deposition and planarization of a second dielectric bonding material layer and bonding a handle substrate to the second dielectric bonding material layer according to the third embodiment of the present disclosure.

Referring to FIG. 48, a second dielectric bonding material layer 254 is deposited on the first dielectric bonding material layer and the second epitaxial semiconductor portion 70. The second dielectric bonding material layer 254 includes a dielectric material that can provide sufficient adhesion to the second semiconductor material of the second epitaxial semiconductor portion 70 so as to prevent detachment of the second semiconductor material. In one embodiment, the second dielectric bonding material layer 254 can include an undoped silicon oxide material (such as undoped silicate glass (USG)), a doped semiconductor oxide material (such as borophosphosilicate glass, borosilicate glass, phosphosilicate glass, fluorosilicate glass, etc.), a spin-on glass (SOG) material, or a combination thereof. The thickness of the second dielectric bonding material layer 254 can be from 3 nm to 300 nm, although lesser and greater thicknesses can also be employed.

The composition of the second dielectric bonding material layer 254 may be the same as, or may be different from, the composition of the second dielectric bonding material layer 252. The second dielectric bonding material layer 254 may include a self-planarizing material such as SOG, or may be planarized after deposition, for example, by chemical mechanical planarization (CMP).

Optionally, the first dielectric bonding material layer 252 may be removed prior to deposition of the second dielectric bonding material layers 254. Thus, one or two dielectric bonding material layers may be present over the top surface of the dielectric masking layer 242. The entirety of the dielectric bonding material layers (252, 254) is herein referred to as at least one dielectric bonding material layer 250.

Subsequently, a handle substrate 8 is bonded to the at least one dielectric bonding material layer 250 in the same manner as in the first embodiment.

Figure 49:
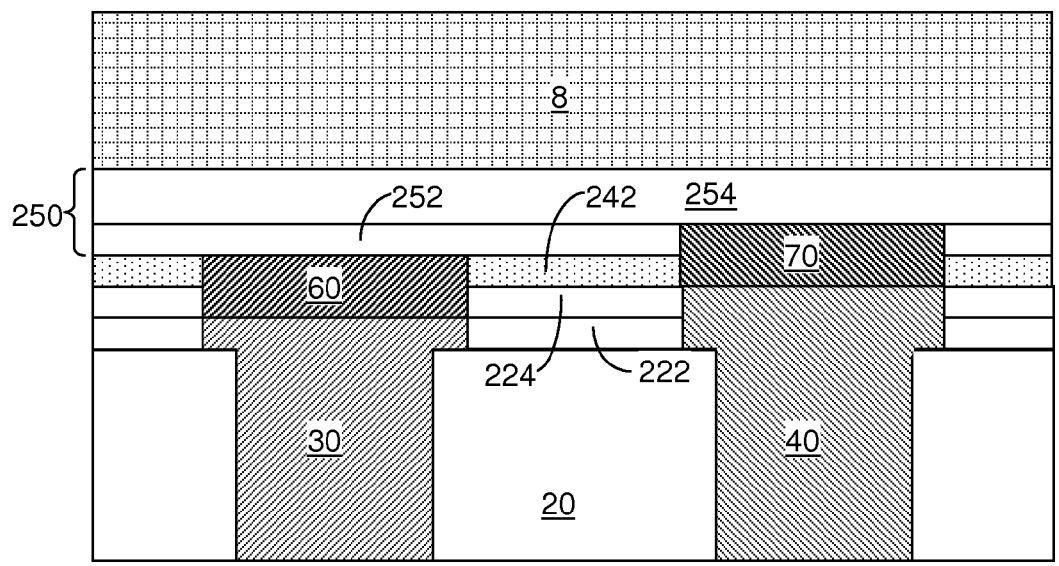
FIG. 49 is a vertical cross-sectional view of the third exemplary semiconductor structure after removal of the single crystalline substrate according to the third embodiment of the present disclosure.

Referring to FIG. 49, the single crystalline substrate 10 is removed. For example, the processing steps of FIG. 22 of the first embodiment may be employed to remove the single crystalline substrate 10.

Figure 50:
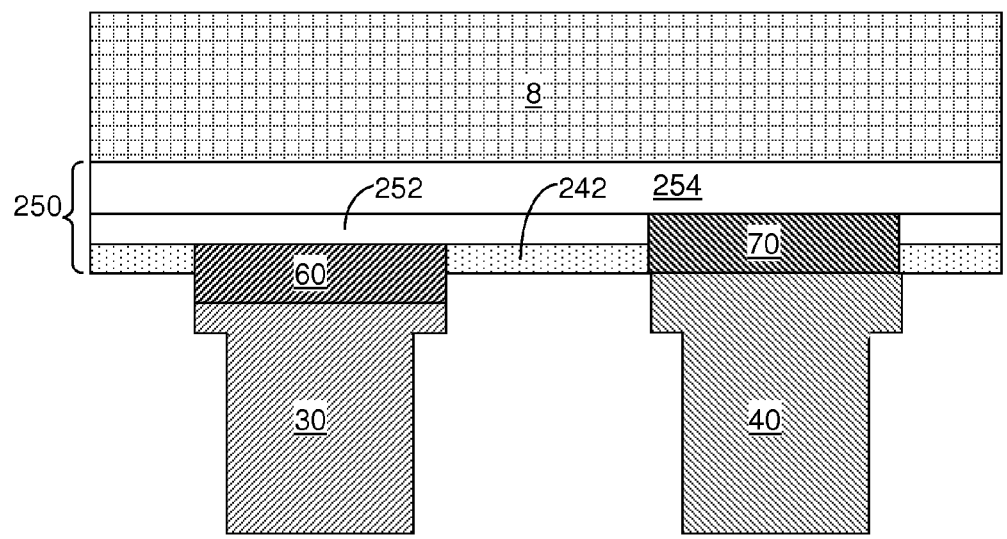
FIG. 50 is a vertical cross-sectional view of the third exemplary semiconductor structure after removal of the dielectric template material layer according to the third embodiment of the present disclosure.

Referring to FIG. 50, the dielectric template material layer 20 is removed. For example, the processing steps of FIG. 23 of the first embodiment may be employed to remove the dielectric template material layer 20.

Figure 51:
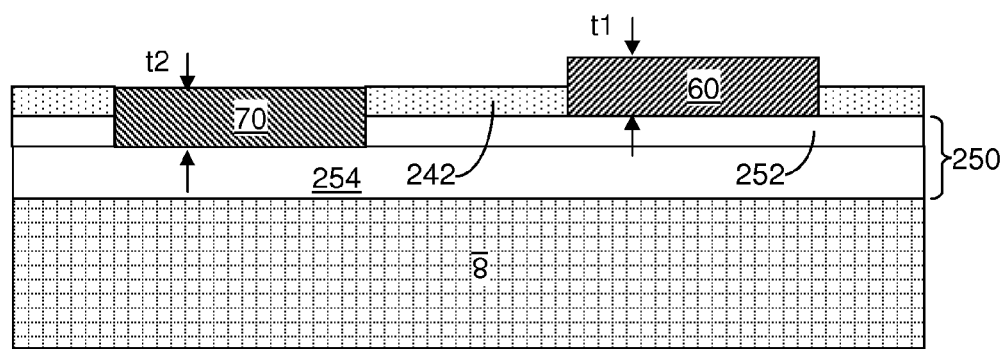
FIG. 51 is a vertical cross-sectional view of the third exemplary semiconductor structure after removal of the first template epitaxial semiconductor material portion, removal of the second template epitaxial semiconductor material portion, removal of the dielectric hard mask layer, and flipping the third exemplary semiconductor structure upside down according to the third embodiment of the present disclosure.

Referring to FIG. 51, the first and second template epitaxial semiconductor material portions (30, 40) are removed selective to the first and second semiconductor portions (60, 70), respectively. For example, the processing steps of FIGS. 24 and 25 of the first embodiment may be performed to remove the first and second template epitaxial semiconductor material portions (30, 40). The third exemplary semiconductor structure can be flipped upside down.

The third exemplary semiconductor structure includes at least one dielectric bonding material layer 250 located on a handle substrate 8, and a first epitaxial semiconductor portion 60 and a second epitaxial semiconductor portion 70. At least a lower portion of one of the first and second epitaxial semiconductor portions (60, 70), i.e., a lower portion of the second epitaxial semiconductor portion 70, is embedded within the at least one bonding material layer 250. One of the first and second epitaxial semiconductor portions (60, 70) include a single crystalline elemental semiconductor material, and another of the first and second epitaxial semiconductor portions (60, 70) include a single crystalline compound semiconductor material.

In one embodiment, each of the first and second epitaxial semiconductor portions (60, 70) has a bottommost surface that is a crystallographic facet, i.e., a crystallographic facet that is within the horizontal plane of the surfaces of the first dielectric bonding material layer 252.

In one embodiment, a lower portion of the second epitaxial semiconductor portion 70 is embedded within the at least one dielectric bonding material layer 250, and a bottommost surface of the first epitaxial semiconductor portion 60 contacts a topmost surface of the at least one dielectric bonding material layer 250. The dielectric masking layer 242 is a dielectric material layer located on the dielectric bonding material layer 250, and can have a composition different from each of the at least one dielectric bonding material layer 250. A top surface of the second epitaxial semiconductor portion 70 is coplanar with a topmost surface of the dielectric masking layer.

An upper portion of the first epitaxial semiconductor layer 60 protrudes above a horizontal plane including the topmost surface of the dielectric masking layer 242. Each of the first and second epitaxial semiconductor portions (60, 70) can have a rectangular shape in a vertical cross-sectional view.

Figure 52:
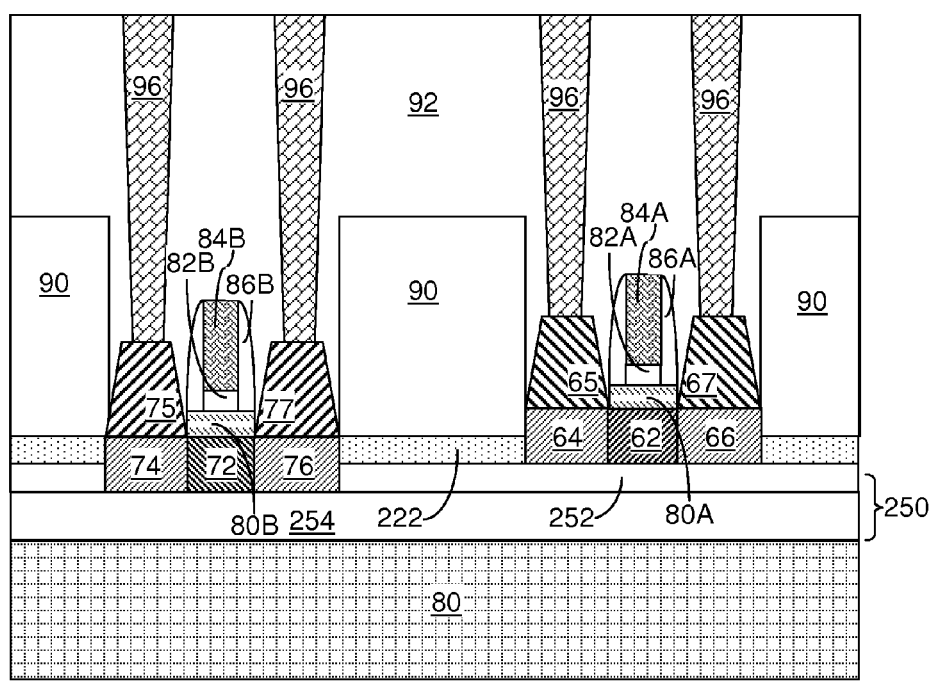
FIG. 52 is a vertical cross-sectional view of the third exemplary semiconductor structure after formation of a first field effect transistor, a second field effect transistor, and a contact level dielectric layer and contact via structures therethrough according to the third embodiment of the present disclosure.

Referring to FIG. 52, the processing steps of FIGS. 27-31 can be performed. As in the first embodiment, one of the first and second field effect transistors can be a p-type field effect transistor, and another of the first and second field effect transistors can be an n-type field effect transistor. A body region, a source region, and a drain region of the n-type field effect transistor can include the single crystalline compound semiconductor material, and a body region, a source region, and a drain region of the p-type field effect transistor can include the single crystalline elemental semiconductor material so as to provide optimal charge carrier mobility to the p-type field effect transistor and the n-type field effect transistor.

Figure 53:
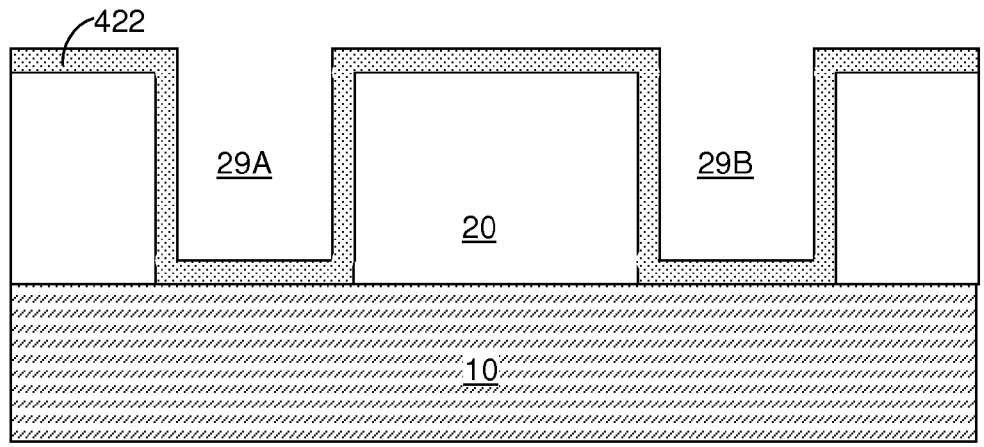
FIG. 53 is a vertical cross-sectional view of a fourth exemplary semiconductor structure after formation of a dielectric hard mask layer in the first and second trenches according to the fourth embodiment of the present disclosure.

Referring to FIG. 53, a fourth exemplary semiconductor structure according to a fourth embodiment of the present disclosure can be derived from the second exemplary structure of FIG. 33 or various variations thereof by depositing a dielectric hard mask layer 422 within the first and second trenches (29A, 29B). The dielectric hard mask layer 422 can include any material that can be employed for the dielectric hard mask layer 22 of the first embodiment. The thickness of the dielectric hard mask layer 422 is selected to avoid filling of the first or second trenches (29A, 29B).

Figure 54:
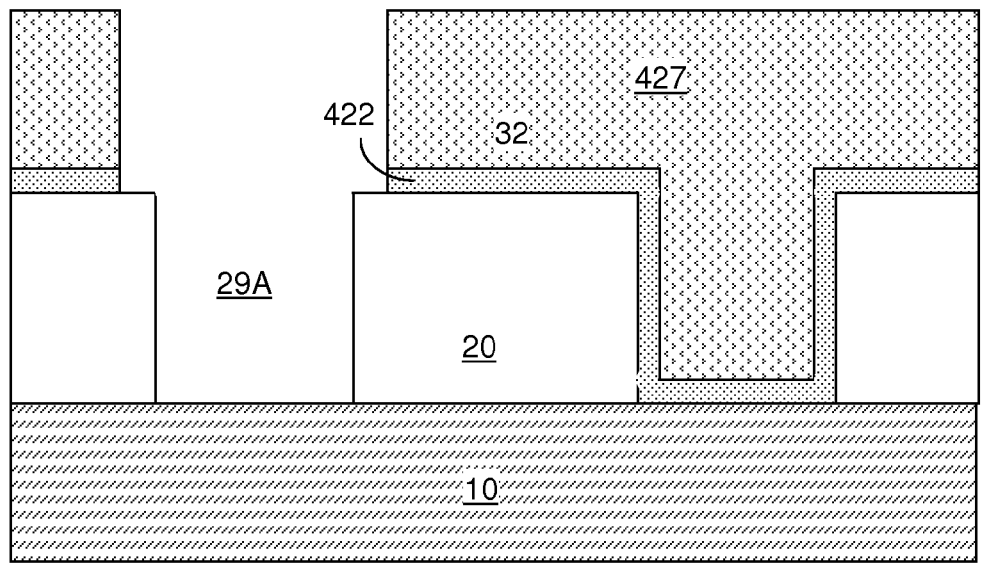
FIG. 54 is a vertical cross-sectional view of the fourth exemplary semiconductor structure after removal of portions of the dielectric hard mask layer from within the first trench according to the fourth embodiment of the present disclosure.

Referring to FIG. 54, portions of the dielectric hard mask layer 422 are removed from within the first trench 29A. First sidewalls of the dielectric template material layer 20 and a first surface of the single crystalline substrate 10 are physically exposed within the first trench 29A. The removal of the portions of the dielectric hard mask layer 422 from within the first trench 29A can be effected, for example, by forming a first patterned photoresist layer 427 over the dielectric hard mask layer 422 such that the first patterned photoresist layer 427 includes an opening that overlies the first trench 29A. Physically exposed portions of the dielectric hard mask layer 422 can be removed by an etch selective to the dielectric material of the dielectric template material layer 20. The first patterned photoresist layer 427 is subsequently removed, for example, by ashing.

Figure 55:
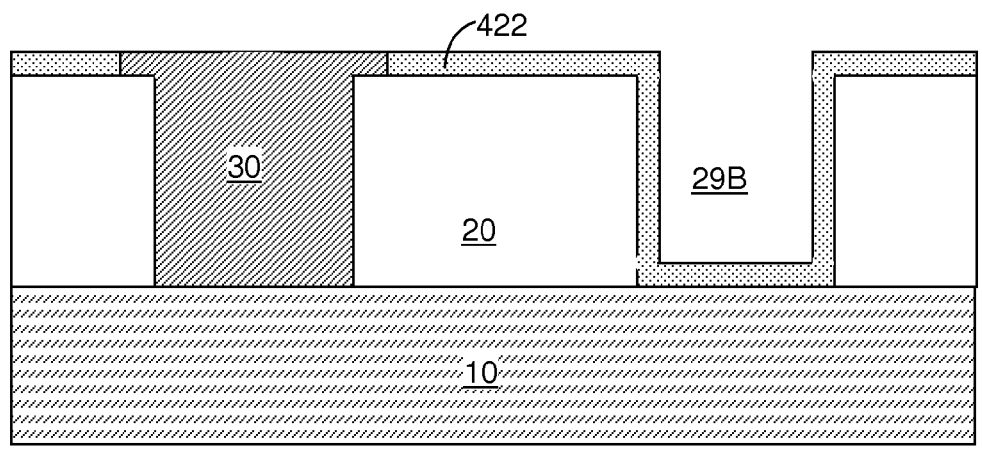
FIG. 55 is a vertical cross-sectional view of the fourth exemplary semiconductor structure after formation of a first template epitaxial semiconductor material portion within the first trench according to the fourth embodiment of the present disclosure.

Referring to FIG. 55, the processing steps of FIGS. 9 and 10 are performed while the dielectric hard mask layer 422 provides the function of the dielectric masking layer 22 of the first embodiment to prevent nucleation of any semiconductor material thereupon. A first template epitaxial semiconductor material portion 30 is formed within the first trench 29A. Because of the presence of the dielectric hard mask layer 422 in the second trench 29B, a second template epitaxial semiconductor material portion is not formed at this step in contrast with the first embodiment.

Figure 56:
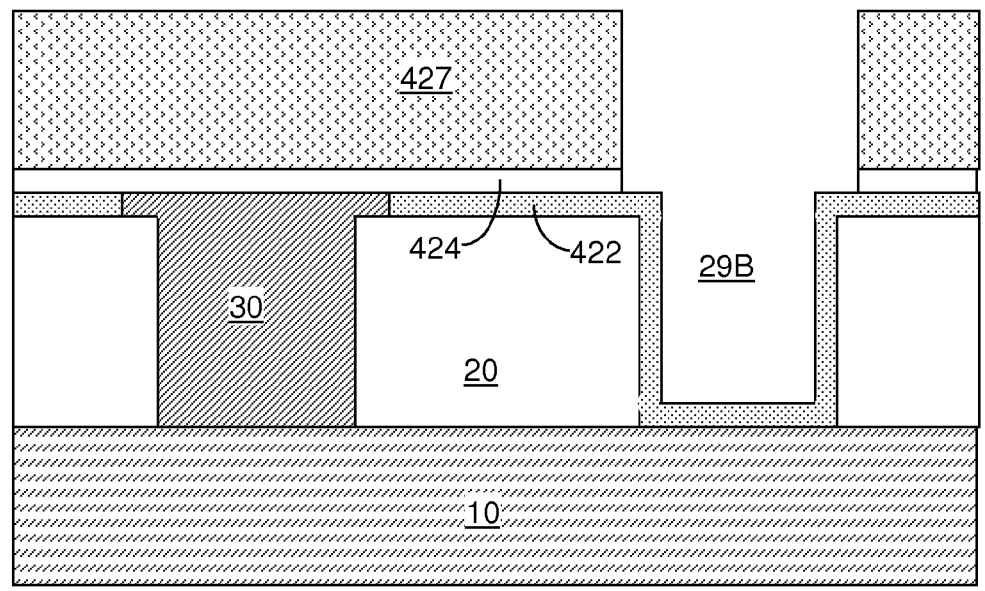
FIG. 56 is a vertical cross-sectional view of the fourth exemplary semiconductor structure after formation and patterning of a disposable masking layer to form an opening over the second trench according to the fourth embodiment of the present disclosure.

Referring to FIG. 56, a disposable masking layer 424 is formed over the dielectric hard mask layer 422 and the first template epitaxial semiconductor material portion 30. The disposable masking layer 424 includes a material that is different from the material of the dielectric hard mask layer 422. For example, the disposable masking layer 424 can include silicon nitride, silicon oxynitride, or silicon oxide. The thickness of the disposable masking layer 424 can be from 3 nm to 60 nm, although lesser and greater thicknesses can also be employed. A second patterned photoresist layer 429 is formed over the disposable masking layer 424. The second patterned photoresist layer 429 includes an opening that overlies the second cavity 29B.

Figure 57:
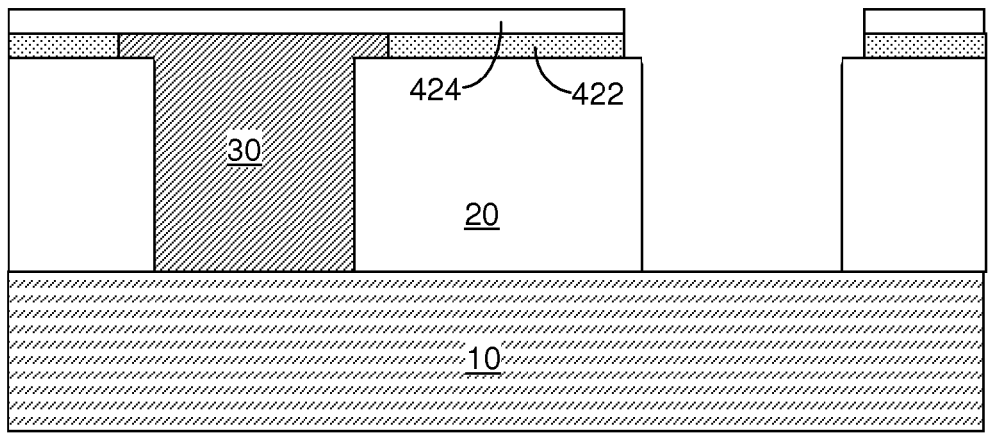
FIG. 57 is a vertical cross-sectional view of the fourth exemplary semiconductor structure after removal of portions of the dielectric hard mask layer from within the second trench according to the fourth embodiment of the present disclosure.

Referring to FIG. 57, physically exposed portions of the disposable masking layer 424 are removed, for example, by etching. The dielectric hard mask layer 422 is removed from within the second cavity 29B employing an etch chemistry that etches the material of the dielectric hard mask layer selective to the dielectric template material layer 20 and the disposable masking layer 424.

Figure 58:
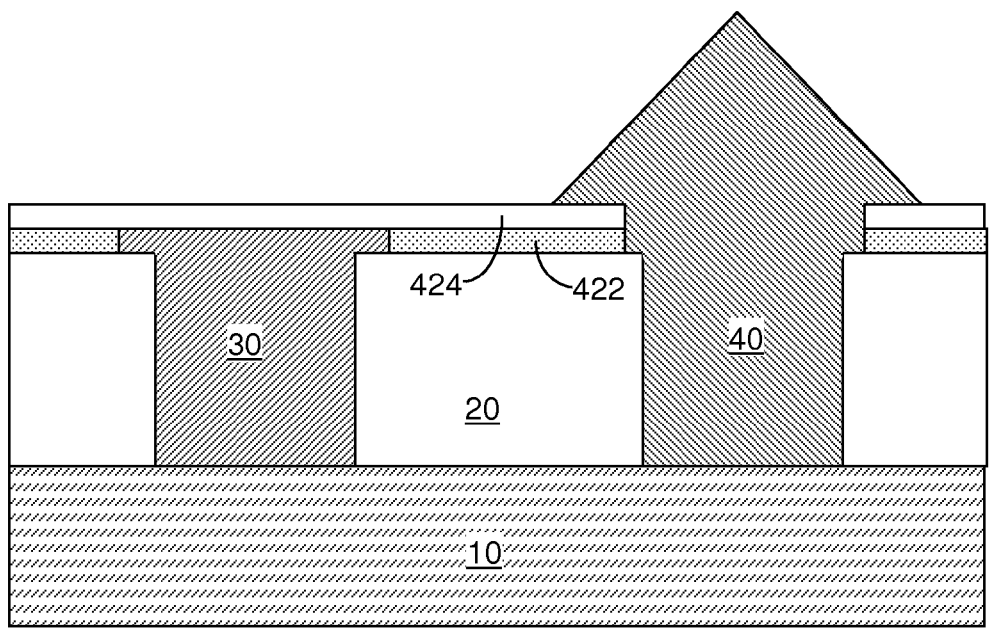
FIG. 58 is a vertical cross-sectional view of the fourth exemplary semiconductor structure after formation of a second template epitaxial semiconductor material portion within the first trench according to the fourth embodiment of the present disclosure.

Referring to FIG. 58, the processing steps of FIG. 13 are performed while the first disposable masking layer 424 provides the function of the disposable masking layer 24 of the first embodiment to prevent nucleation of any semiconductor material thereupon. A second template epitaxial semiconductor material portion 40 is formed within the second trench 29B at this step.

Figure 59:
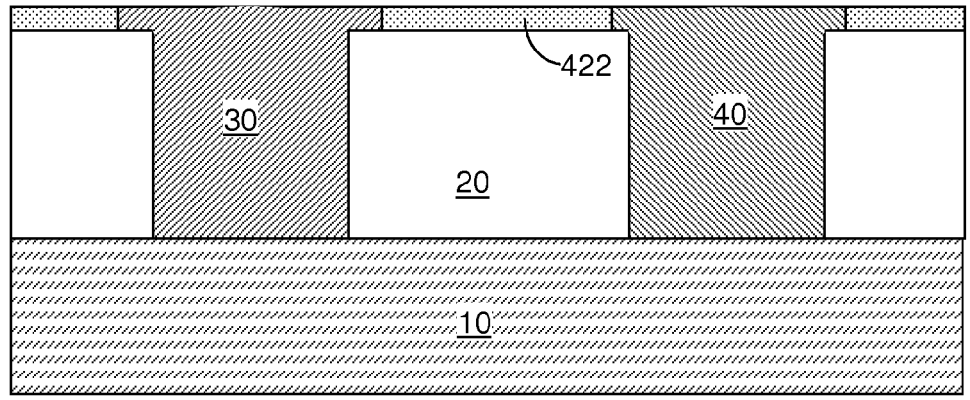
FIG. 59 is a vertical cross-sectional view of the fourth exemplary semiconductor structure after planarization of the second template epitaxial semiconductor material portion according to the fourth embodiment of the present disclosure.

Referring to FIG. 59, the processing steps of FIG. 14 is performed while the dielectric hard mask layer 422 provides the function of the dielectric hard mask layer 22 of the first embodiment to prevent nucleation of any semiconductor material thereupon. A top surface of the second template epitaxial semiconductor material portion 40 is coplanar with a top surface of the dielectric hard mask layer 422 after the planarization process.

The processing steps of FIGS. 15-31 can be subsequently performed such that the dielectric hard mask layer 422 provides the function of the dielectric hard mask layer 22 of the first embodiment.

Figure 60:
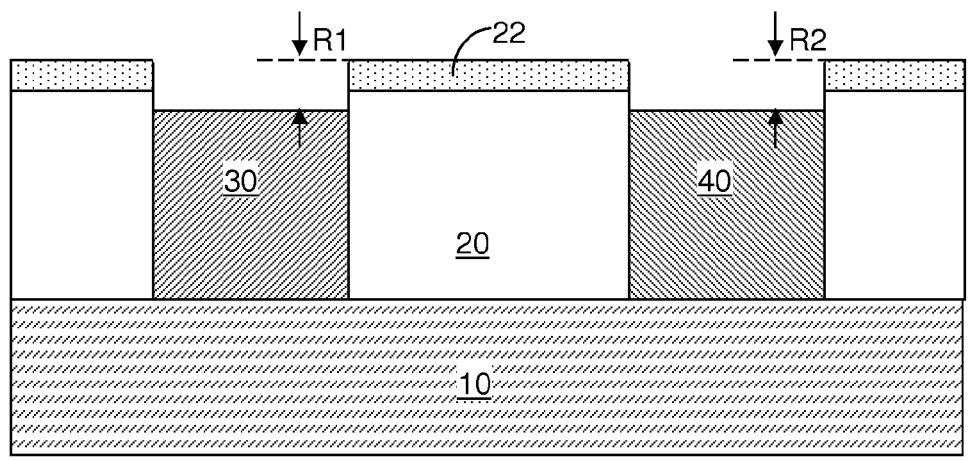
FIG. 60 is a vertical cross-sectional view of a fifth exemplary semiconductor structure after recessing first and second template epitaxial semiconductor material portions according to a fifth embodiment of the present disclosure.

Referring to FIG. 60, a fifth exemplary semiconductor structure according to a fifth embodiment of the present disclosure can be derived from the first exemplary semiconductor structure of FIG. 14, the second exemplary semiconductor structure of FIG. 41, or the fourth exemplary semiconductor structure of FIG. 59 by recessing first and second template epitaxial semiconductor material portions (30, 40). For example, the top surface of the first template epitaxial semiconductor material portion 30 can be vertically recessed by a first recess depth R1 employing a first recess etch, and the top surface of the second template epitaxial semiconductor material portion 40 can be vertically recessed by a second recess depth R2 employing a second recess etch. The first recess etch and the second recess etch may be the same etch, or two different etches employing disposable masking material layer to provide differential recessing of the first and second template epitaxial semiconductor material portions (30, 40).

Figure 61:
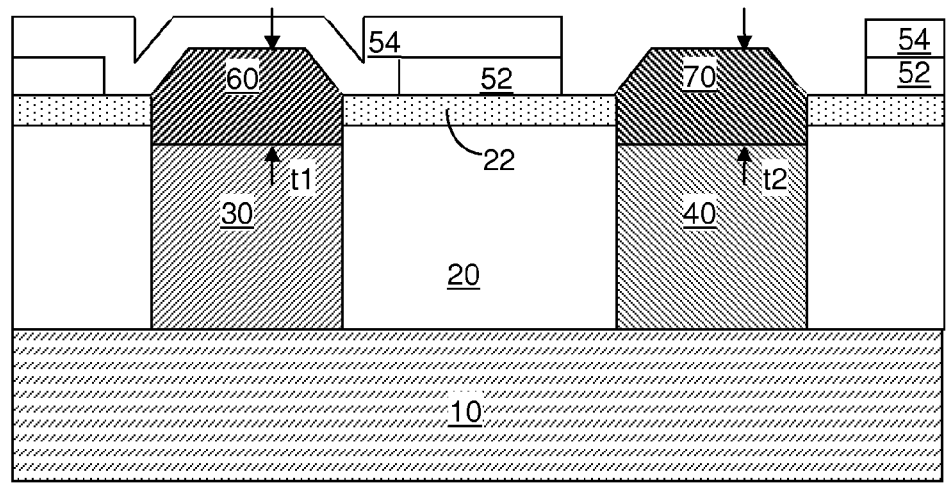
FIG. 61 is a vertical cross-sectional view of the fifth exemplary semiconductor structure after formation of first and second epitaxial semiconductor portions according to the fifth embodiment of the present disclosure.

Referring to FIG. 61, the processing steps of FIGS. 15 and 16 can be performed. The thickness of the first epitaxial semiconductor portion 60 is herein referred to as the first thickness t1, and the thickness of the second epitaxial semiconductor portion 60 is herein referred to as the second thickness t2.

Figure 62:
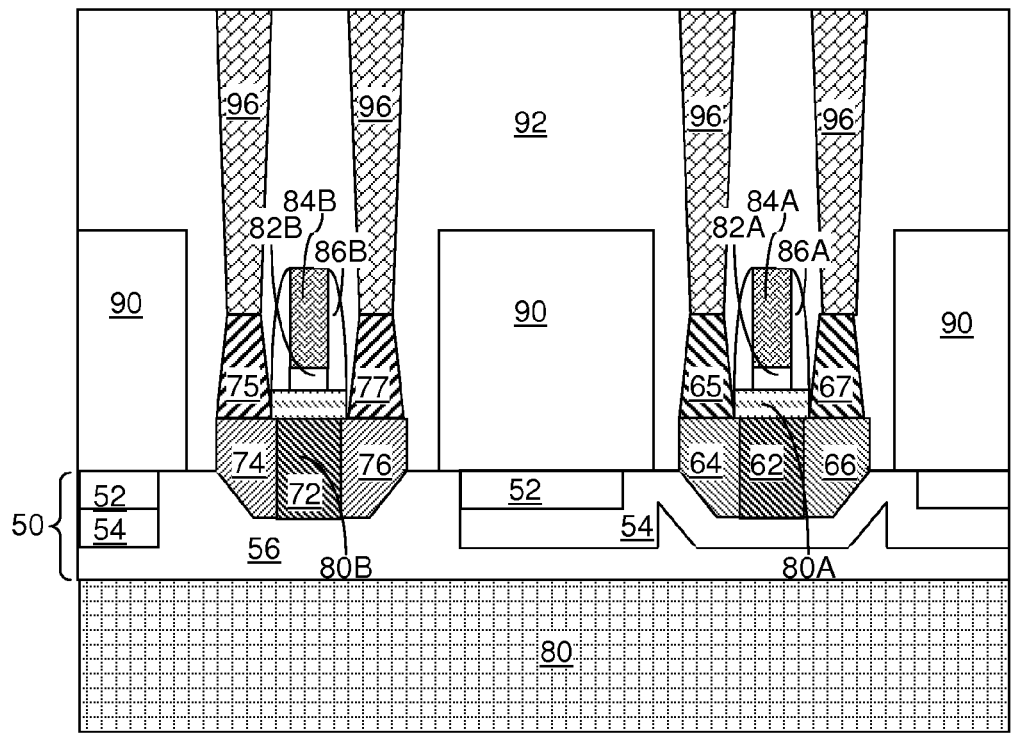
FIG. 62 is a vertical cross-sectional view of the fifth exemplary semiconductor structure after formation of a first field effect transistor, a second field effect transistor, and a contact level dielectric layer and contact via structures therethrough according to the fifth embodiment of the present disclosure.

Referring to FIG. 62, the processing steps of FIGS. 17-31 can be performed. The fifth exemplary semiconductor structure can include at least one dielectric bonding material layer 50 located on a handle substrate 8, and a first epitaxial semiconductor portion (62, 64, 66) and a second epitaxial semiconductor portion (72, 74, 76). At least a lower portion of each of the first and second epitaxial semiconductor portions (62, 64, 66, 72, 74, 76) is embedded within the at least one bonding material layer 50. One of the first and second epitaxial semiconductor portions include a single crystalline elemental semiconductor material, and another of the first and second epitaxial semiconductor portions include a single crystalline compound semiconductor material.

Each of the first and second epitaxial semiconductor portions (62, 64, 66, 72, 74, 76) can have a bottommost surface that is a crystallographic facet. In one embodiment, surfaces of each of the first and second epitaxial semiconductor portions includes a plurality of angled crystallographic facets that are not horizontal and not vertical. In one embodiment, all of the plurality of angled crystallographic facets is in physical contact with surfaces of the at least one dielectric bonding material layer 50.

Each of the first and second epitaxial semiconductor portions (62, 64, 66, 72, 74, 76) can have a topmost surface that is located above a topmost surface of the at least one dielectric bonding material layer 50. Each of the first and second epitaxial semiconductor portions has a vertical cross-sectional shape that is the same as a union of a rectangular shape and a trapezoidal shape in which a side of the rectangular shape coincides with, and is adjoined to, one of parallel sides of the trapezoidal shape.

The embodiments of the present disclosure makes it possible to form one or more Group IV devices, i.e., elemental semiconductor devices, that include IV channel structures made from group IV material and one or more III-V devices, i.e., compound semiconductor devices, that include III-V channel structures made from group III-V material on a same buried insulator layer, i.e., the at least one dielectric bonding material layer, located on the same substrate. In some embodiment, surfaces of various components of the one or more Group IV devices and the one or more III-V devices can be coplanar among one another as a result of planarization and/or as a result of conformal depositions. In some embodiment, the lateral distance between the one or more Group V device III-V device and the one or more III-V devices can be less than 200 nm. In another embodiment, the lateral distance can be less than 100 nm. In yet another embodiment, the lateral distance can be in a range from 20 nm to 100 nm.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising
   forming a first trench and a second trench through a dielectric template material layer on a single crystalline substrate;
   forming a first template epitaxial semiconductor material portion within said first trench by epitaxy of a first template semiconductor material and forming a second template epitaxial semiconductor material portion within said second trench by epitaxy of a second template semiconductor material, wherein one of the first and second template semiconductor materials is an elemental semiconductor material, and another of said first and second template semiconductor materials is a compound semiconductor material;
   epitaxially growing a first epitaxial semiconductor portion including a first semiconductor material that is different from said first template semiconductor material on said first template epitaxial semiconductor material portion;
   epitaxially growing a second epitaxial semiconductor portion including a second semiconductor material that is different from said second template semiconductor material on said second template epitaxial semiconductor material portion;
   forming at least one dielectric bonding material layer over said first and second epitaxial semiconductor portions; and
   bonding a handle substrate to said at least one dielectric bonding material layer; and
   removing said single crystalline substrate, said dielectric template material layer, and said first and second template epitaxial semiconductor material portions.

2. The method of claim 1, further comprising:
   forming at least one elemental semiconductor device on one of said first and second epitaxial semiconductor portions; and
   forming at least one compound semiconductor device on another of said first and second epitaxial semiconductor portions.

3. The method of claim 1, wherein at least a bottom portion of one of said first and second epitaxial semiconductor portions is embedded within said at least one dielectric bonding material layer upon said removing of said single crystalline substrate, said dielectric template material layer, and said first and second template epitaxial semiconductor material portions.

4. The method of claim 1, wherein said single crystalline semiconductor substrate has a substrate lattice constant, said first template epitaxial semiconductor material has a first lattice constant, and said second template epitaxial semiconductor material has a second lattice constant, wherein at least one of said first lattice constant and said second lattice constant is different from said substrate lattice constant.

5. The method of claim 4, wherein at least one of said first lattice constant and said second lattice constant differs from said substrate lattice constant by a mismatch percentage of said substrate lattice constant, wherein said mismatch percentage is in a range from 1.0% to 15%.

6. The method of claim 4, wherein each of said first template epitaxial semiconductor material portion and said second template epitaxial semiconductor material portion are epitaxially aligned to a single crystalline structure of said single crystalline substrate with a lattice mismatch.

7. The method of claim 1, wherein said first trench and said second trench has an aspect ratio greater than 1.0.

8. The method of claim 1, further comprising:
   forming a dielectric hard mask layer on said dielectric template material layer, wherein said first trench and said second trench are formed through said dielectric hard mask layer; and
   removing portions of said first template semiconductor material and said second template semiconductor material employing said dielectric hard mask layer as a stopping layer during planarization processes.

9. The method of claim 1, further comprising:
   forming another first template epitaxial semiconductor material portion comprising said first template semiconductor material within said second trench simultaneously with formation of said first template epitaxial semiconductor material portion; and
   removing said another first template epitaxial semiconductor material portion from said second trench, wherein said second template epitaxial semiconductor material portion is formed after said another first template epitaxial semiconductor material portion is removed.

10. The method of claim 9, further comprising:
    covering said second template epitaxial semiconductor material portion with a patterned first dielectric bonding material layer while physically exposing a top surface of said first template epitaxial semiconductor material portion; and
    depositing said first epitaxial semiconductor portion directly on said first template epitaxial semiconductor material portion employing a selective epitaxy process, wherein said at least one dielectric bonding material layer comprises said patterned first dielectric bonding material layer.

11. The method of claim 10, further comprising:
    covering said first epitaxial semiconductor portion with a patterned second dielectric bonding material layer while physically exposing a top surface of said second template epitaxial semiconductor material portion; and
    depositing said second epitaxial semiconductor portion directly on said second template epitaxial semiconductor material portion employing another selective epitaxy process, wherein said at least one dielectric bonding material layer further comprises said patterned second dielectric bonding material layer.

12. The method of claim 11, further comprising:
    depositing a third dielectric bonding material layer on said second dielectric bonding material layer and said second epitaxial semiconductor portion; and
    planarizing a top surface of said third dielectric bonding material layer, wherein said at least one dielectric bonding material layer further comprises said third dielectric bonding material layer.

13. The method of claim 1, further comprising:
    forming at least one lattice-mismatched epitaxial semiconductor material layer on said single crystalline substrate, wherein said at least one lattice-mismatched epitaxial semiconductor material layer is in epitaxial alignment with a single crystalline structure of said single crystalline substrate;
    depositing a dielectric material on said at least one lattice-mismatched epitaxial semiconductor material layer to form said dielectric template material layer; and
    etching at least portions of said dielectric template material layer to form said first and second trenches.

14. The method of claim 1, wherein said first and second trenches extend into said single crystalline substrate, and bottom surfaces of said first and second trenches include faceted crystallographic surfaces of said single crystalline substrate.

15. The method of claim 14, wherein sidewall surfaces of said first and second trenches include vertical surfaces of said single crystalline substrate.

16. The method of claim 14, further comprising:
    converting surface portions of said single crystalline substrate into dielectric material portions by oxidation, nitridation, or a combination thereof; and
    physically exposing surfaces of said single crystalline substrate by removing bottom subportions of said dielectric material portion by an anisotropic etch.

17. The method of claim 1, wherein said single crystalline substrate is removed by grinding, polishing, etching, cleaving, or a combination thereof.

18. The method of claim 1, further comprising forming a dielectric hard mask layer on said dielectric template material layer, wherein said first trench and said second trench are formed through said dielectric hard mask layer, wherein said removing of said dielectric template material layer comprises etching said dielectric template material layer selective to said dielectric hard mask layer.

19. The method of claim 1, wherein said removing of said first and second template epitaxial semiconductor material portions comprise:
    etching said first template epitaxial semiconductor material portion selective to said first epitaxial semiconductor portion; and
    etching said second template epitaxial semiconductor material portion selective to said second epitaxial semiconductor portion.

20. The method of claim 1, further comprising:
    concurrently forming a first disposable material portion and a second disposable material portion within said first trench and said second trench, respectively;
    removing said first disposable material portion from said first trench and subsequently filling said first trench with said first template epitaxial semiconductor material portion; and
    removing said second disposable material portion from said second trench and subsequently filling said second trench with said second template epitaxial semiconductor material portion.

21. The method of claim 1, further comprising:
    forming a dielectric hard mask layer within said first and second trenches;
    removing portions of said dielectric hard mask layer from said first trench, wherein first sidewalls of said dielectric template material layer and a first surface of said single crystalline substrate are physically exposed, and wherein said first template epitaxial semiconductor material portion is subsequently deposited within said first trench; and
    removing other portions of said dielectric hard mask layer from said second trench, wherein second sidewalls of said dielectric template material layer and a second surface of said single crystalline substrate are physically exposed, and wherein said second template epitaxial semiconductor material portion is subsequently deposited within said second trench.

22. The method of claim 1, further comprising:
    forming a body region, a source region, and a drain region of a first field effect transistor in said first epitaxial semiconductor portion; and forming a body region, a source region, and a drain region of a second field effect transistor in said second epitaxial semiconductor portion.

23. The method of claim 22, wherein one of said first and second field effect transistors is a p-type field effect transistor, and another of said first and second field effect transistors is an n-type field effect transistor, and wherein a body region, a source region, and a drain region of said n-type field effect transistor includes said single crystalline compound semiconductor material, and a body region, a source region, and a drain region of said p-type field effect transistor includes said single crystalline elemental semiconductor material.

24. The method of claim 22, further comprising:
forming a capping semiconductor material layer on said first and second epitaxial semiconductor portions;
forming a first gate stack including a first gate dielectric and a first gate electrode and a second gate stack including a second gate dielectric and a second gate electrode over said capping semiconductor material layer; and
patterning said capping semiconductor material layer, wherein a first capping semiconductor material portion underlies said first gate stack and overlies said first epitaxial semiconductor portion, and a second capping semiconductor material portion underlies said second gate stack and overlies said second epitaxial semiconductor portion.

25. The method of claim 1, wherein said single crystalline elemental semiconductor material is selected from single crystalline silicon, single crystalline germanium, a single crystalline silicon-germanium alloy, a single crystalline silicon-carbon alloy, and a single crystalline silicon-germanium-carbon alloy, wherein said single crystalline compound semiconductor material is selected from a III-V compound semiconductor material and a II-V compound semiconductor material, and wherein said handle substrate is selected from a bulk semiconductor substrate, a semiconductor-on-insulator substrate, a stack of at least two semiconductor material layers having different compositions and epitaxially aligned to one another, an insulator substrate, a metallic substrate, and a plastic substrate.

* * * * *